(12) United States Patent
Nishimura

(10) Patent No.: US 12,032,283 B2
(45) Date of Patent: Jul. 9, 2024

(54) IMPRINT APPARATUS AND METHOD OF MANUFACTURING ARTICLE

(71) Applicant: CANON KABUSHIKI KAISHA, Tokyo (JP)

(72) Inventor: Naosuke Nishimura, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 110 days.

(21) Appl. No.: 17/315,825

(22) Filed: May 10, 2021

(65) Prior Publication Data
US 2021/0354363 A1 Nov. 18, 2021

(30) Foreign Application Priority Data

May 13, 2020 (JP) .................. 2020-084790

(51) Int. Cl.
| | |
|---|---|
| *G03F 7/00* | (2006.01) |
| *B29C 43/06* | (2006.01) |
| *B29C 59/00* | (2006.01) |
| *B29C 59/02* | (2006.01) |
| *G03F 7/16* | (2006.01) |
| *G03F 9/00* | (2006.01) |
| *B29C 43/34* | (2006.01) |
| *B29C 43/58* | (2006.01) |

(52) U.S. Cl.
CPC ............ *G03F 7/0002* (2013.01); *B29C 43/06* (2013.01); *B29C 59/002* (2013.01); *B29C 59/022* (2013.01); *G03F 7/161* (2013.01); *G03F 9/00* (2013.01); *G03F 9/7042* (2013.01); *B29C 2043/3433* (2013.01); *B29C 2043/585* (2013.01)

(58) Field of Classification Search
CPC ..................................................... G03F 7/0002
See application file for complete search history.

(56) References Cited

U.S. PATENT DOCUMENTS

| | | | | |
|---|---|---|---|---|
| 6,801,301 | B2 * | 10/2004 | Miyajima | ........... G03F 7/70933 355/72 |
| 10,201,927 | B2 * | 2/2019 | Mizuno | ................ G03F 7/0002 |
| 10,228,624 | B2 * | 3/2019 | Yonekawa | .......... G03F 7/70708 |

(Continued)

FOREIGN PATENT DOCUMENTS

| | | |
|---|---|---|
| JP | S63260193 A | 10/1988 |
| JP | H1041219 A | 2/1998 |

(Continued)

*Primary Examiner* — Atul P. Khare
(74) *Attorney, Agent, or Firm* — ROSSI, KIMMS & McDOWELL LLP

(57) ABSTRACT

The present invention provides an imprint apparatus that forms a pattern in an imprint material on a substrate using a mold including a pattern region, the apparatus comprising: a stage configured to be movable while holding the substrate; and a dispenser configured to discharge the imprint material, wherein a sensor, a receptor, and a mark are provided around a holding region where the substrate is held, in an upper surface of the stage, and the upper surface of the stage includes a first region that passes below the pattern region during movement of the stage between a position below the dispenser and a position below the mold, and a second region that does not pass below the pattern region during the movement, and the sensor, the receptor, and the mark are arranged in the second region.

14 Claims, 15 Drawing Sheets

(56) References Cited

U.S. PATENT DOCUMENTS

| | | | |
|---|---|---|---|
| 10,569,450 B2* | 2/2020 | Seki | H01L 21/67092 |
| 11,137,696 B2* | 10/2021 | Nishimura | G03F 9/7088 |
| 2006/0285093 A1* | 12/2006 | Hara | G03F 7/70341 |
| | | | 355/53 |
| 2017/0235234 A1* | 8/2017 | Yonekawa | G03F 7/70708 |
| | | | 355/72 |
| 2017/0248843 A1* | 8/2017 | Seki | G03F 7/0002 |

FOREIGN PATENT DOCUMENTS

| | | | | |
|---|---|---|---|---|
| JP | 2014225582 A | * | 12/2014 | |
| JP | 2016072624 A | * | 5/2016 | B29C 59/02 |
| JP | 2016076558 A | | 5/2016 | |
| JP | 2017139452 A | * | 8/2017 | B29C 59/04 |
| JP | 2017157821 A | * | 9/2017 | B29C 59/02 |
| JP | 2018082128 A | * | 5/2018 | G03F 7/0002 |
| JP | 2019004074 A | * | 1/2019 | |
| JP | 2019096697 A | * | 6/2019 | |
| JP | 2019096697 A | | 6/2019 | |
| JP | 2019102735 A | | 6/2019 | |
| WO | WO-2016170729 A1 | * | 10/2016 | G03F 7/0002 |
| WO | WO-2017145924 A1 | * | 8/2017 | B29C 33/72 |

\* cited by examiner

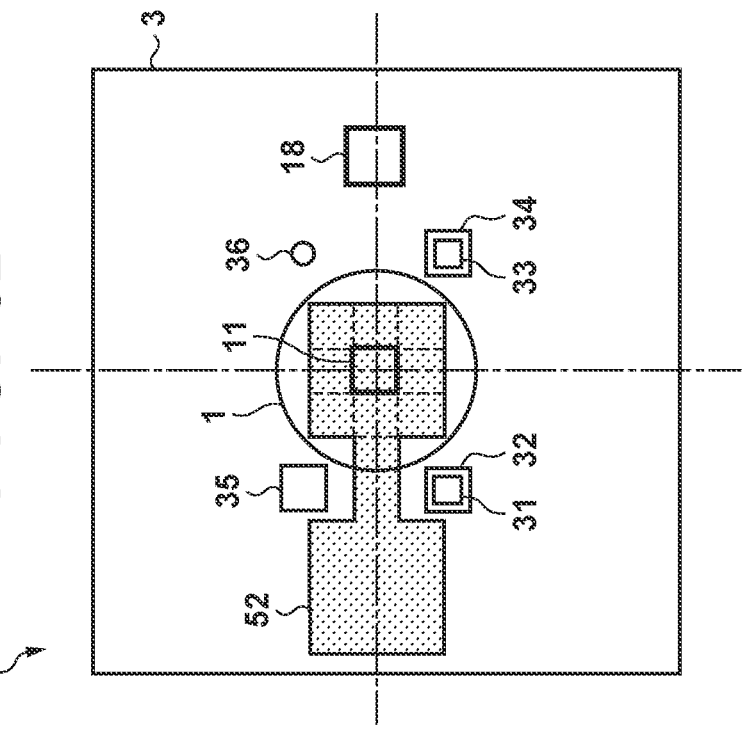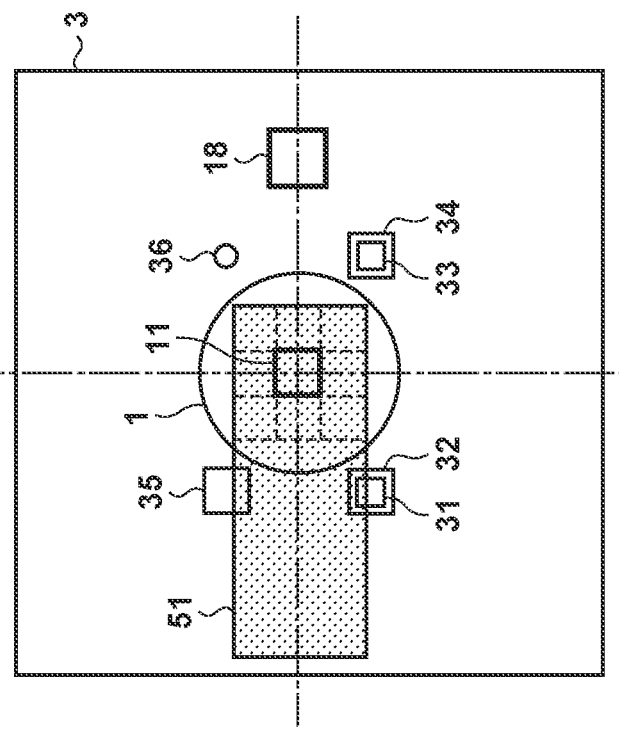

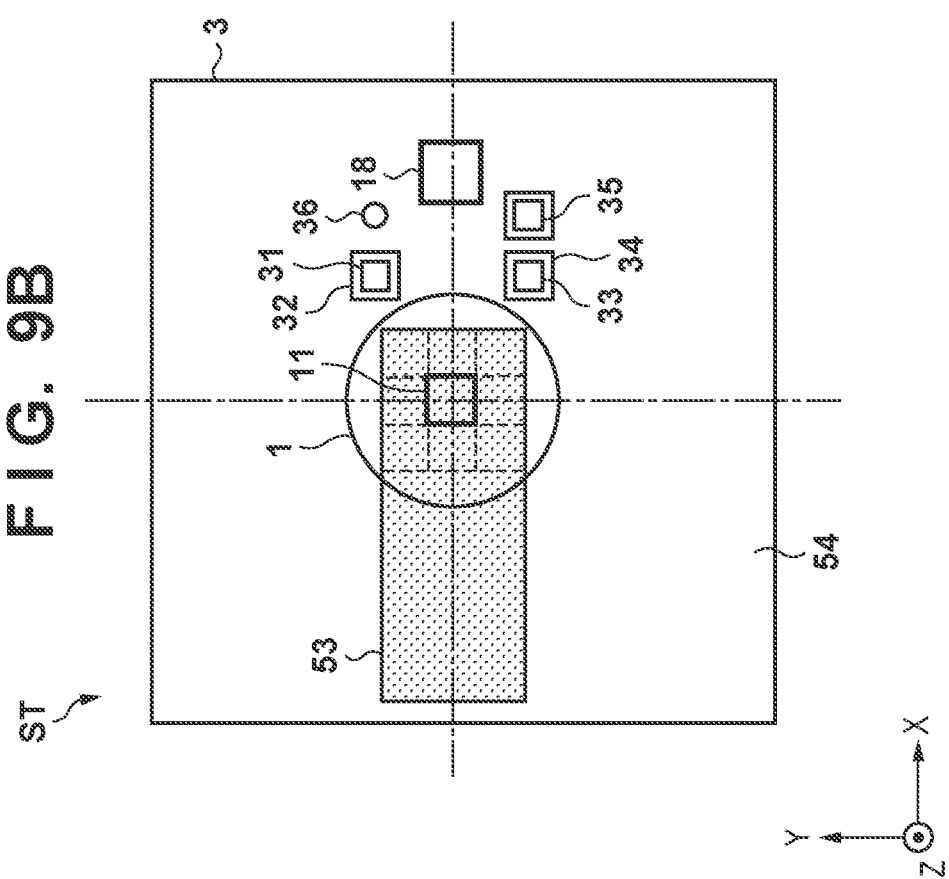
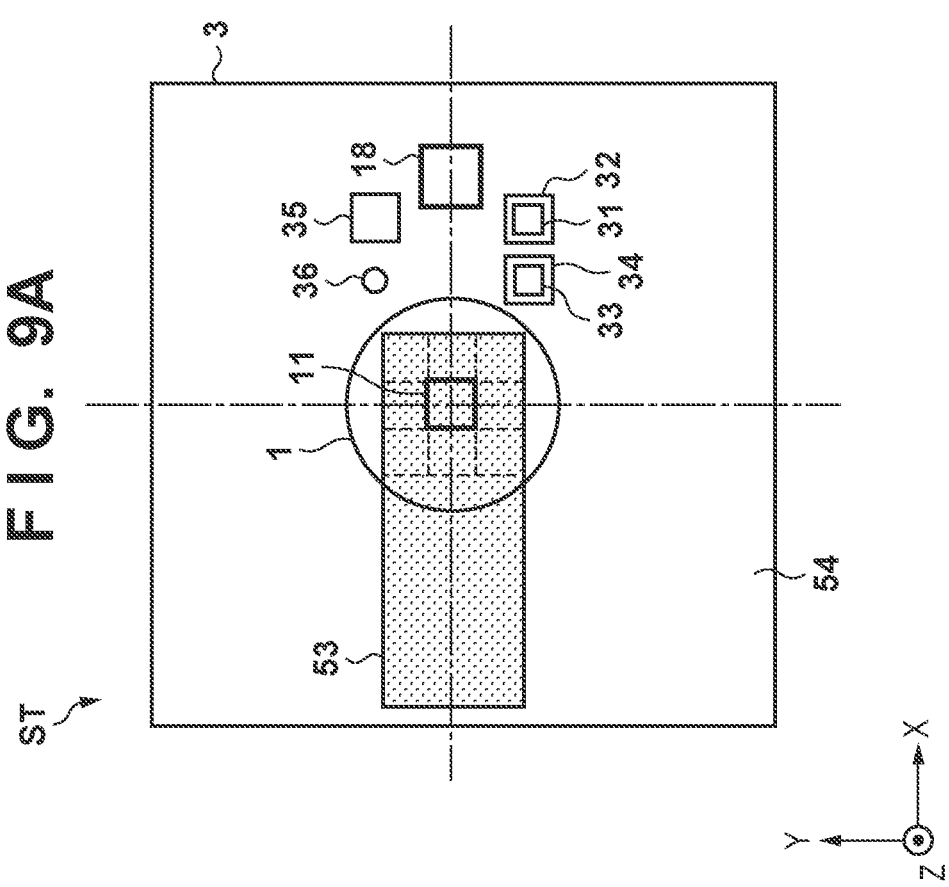

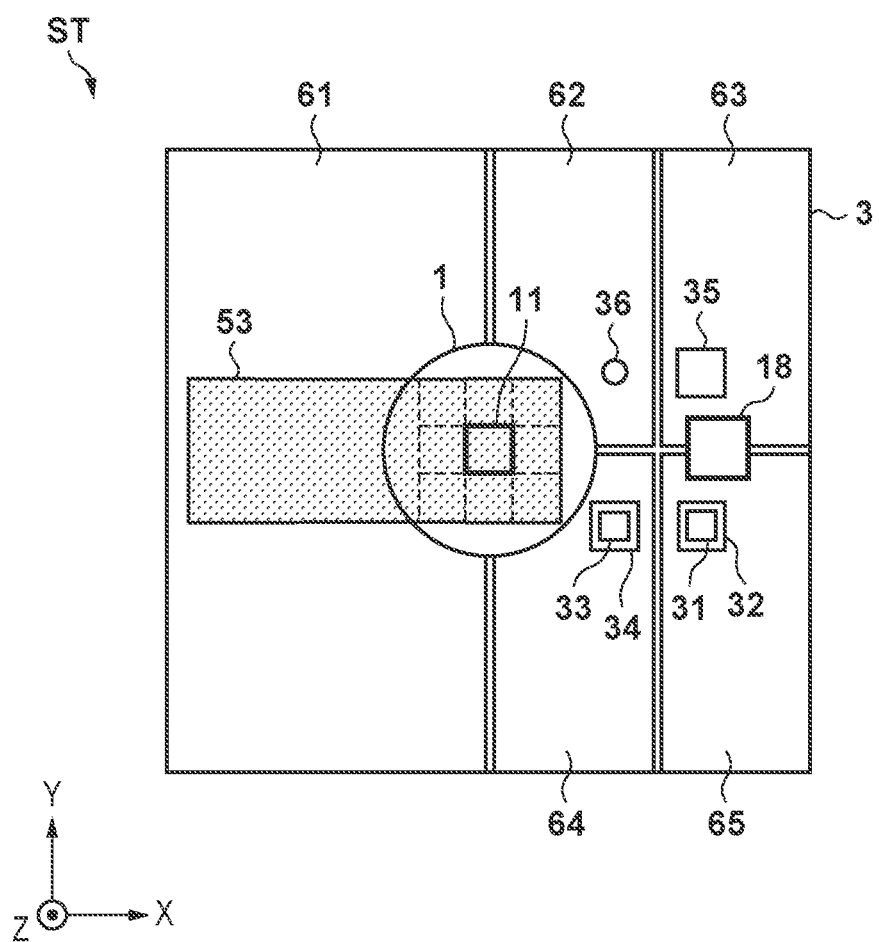

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint apparatus that forms a pattern of an imprint material on a substrate by curing the imprint material in a state in which a mold and the imprint material on the substrate are in contact with each other has received attention as one of mass-production lithography apparatuses for semiconductor devices and the like. In the imprint apparatus, when a mold is separated from a cured imprint material on a substrate, the mold is charged. The electrostatic force (Coulomb force) generated by the charging acts on particles, and the particles can be attracted and adhere to the mold. If pattern formation is performed by bringing the mold into contact with the imprint material on the substrate in a state in which the particles adhere to the mold, a deformed pattern can be formed, or the mold and/or the substrate can be damaged. Japanese Patent Laid-Open No. 2019-96697 discloses that a collector (collection surface), which corrects particles, is provided around an original driving device and particles adhering to a substrate or a surrounding member thereof are sucked and collected by the collector.

In the imprint apparatus, in order to arrange a sensor, a mark, or the like, a gap or a step (concave portion) may be formed in the upper surface of a stage that holds a substrate. Since particles tend to accumulate in such a gap or a step and the method described in Japanese Patent Laid-Open No. 2019-96697 cannot completely remove the particles, the particles remaining in the gap or the step may adhere to a pattern region of the mold.

SUMMARY OF THE INVENTION

The present invention provides, for example, a technique advantageous in reducing adhesion of particles to a pattern region of a mold.

According to one aspect of the present invention, there is provided an imprint apparatus that forms a pattern in an imprint material on a substrate using a mold including a pattern region, the apparatus comprising: a stage configured to be movable while holding the substrate; and a dispenser configured to discharge the imprint material, wherein a sensor configured to detect an illuminance of light which cures the imprint material, a receptor configured to receive the imprint material discharged from the dispenser, and a mark used to detect a position of the stage are provided around a holding region where the substrate is held, in an upper surface of the stage, and the upper surface of the stage includes a first region that passes below the pattern region during movement of the stage between a position below the dispenser and a position below the mold, and a second region that does not pass below the pattern region during the movement, and the sensor, the receptor, and the mark are arranged in the second region.

Further features of the present invention will become apparent from the following description of exemplary embodiments with reference to the attached drawings.

BRIEF DESCRIPTION OF THE DRAWINGS

FIGS. 8A and 8B are views each showing a cumulative passing region of the upper surface of the substrate stage;

FIGS. 9A and 9B are views each showing an arrangement example of a sensor and the like in a surrounding member according to the second embodiment;

FIG. 10 is a view showing the arrangement of a surrounding member and an arrangement example of a sensor and the like according to the third embodiment.

DESCRIPTION OF THE EMBODIMENTS

Figure 1:
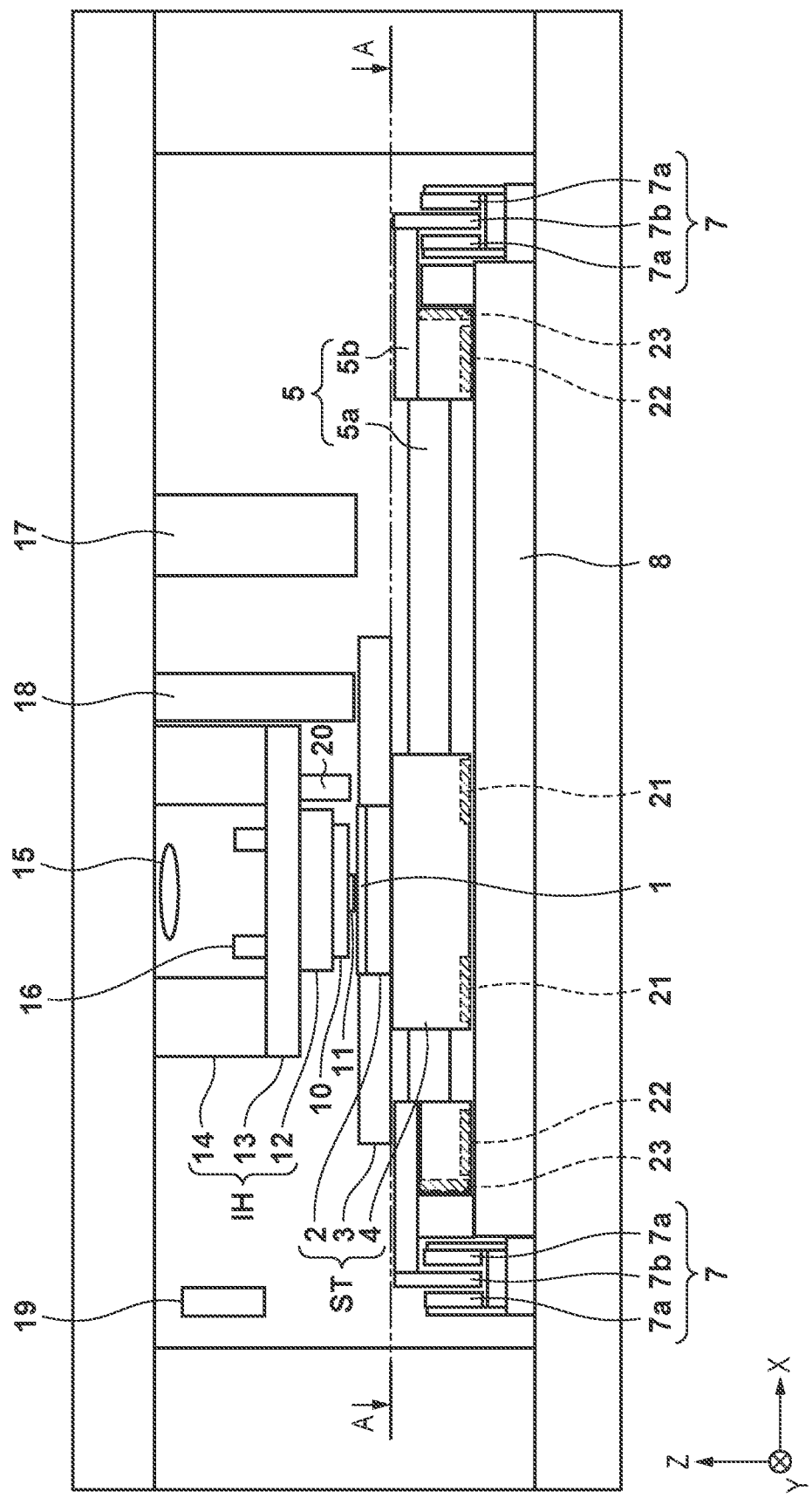
FIG. 1 is a schematic view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

The first embodiment according to the present invention will be described. An imprint apparatus is an apparatus that forms a pattern of a cured product of an imprint material onto which a pattern with convex and concave portions on a mold is transferred by bringing an imprint material supplied onto a substrate into contact with a mold and applying energy for curing the imprint material. For example, the imprint apparatus supplies a liquid imprint material onto a substrate, and cures the imprint material in a state in which a mold on which a pattern with convex and concave portions has been formed is in contact with the imprint material on the substrate. Then, the imprint apparatus increases the spacing between the mold and the substrate, thereby separating the mold from the cured imprint material. Thus, the pattern of the mold can be transferred to the imprint material on the substrate. Such a series of processes is called an "imprint process", and is performed for each of a plurality of shot regions on the substrate.

As the imprint material, a curable composition (to be also referred to as a resin in an uncured state) that is cured by receiving curing energy is used. As the curing energy, an electromagnetic wave, heat, or the like is used. The electromagnetic wave is light selected from the wavelength range of 10 nm (inclusive) to 1 mm (inclusive), for example, infrared light, a visible light beam, ultraviolet light, or the like.

The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

[Arrangement of Imprint Apparatus]

Figure 2A:
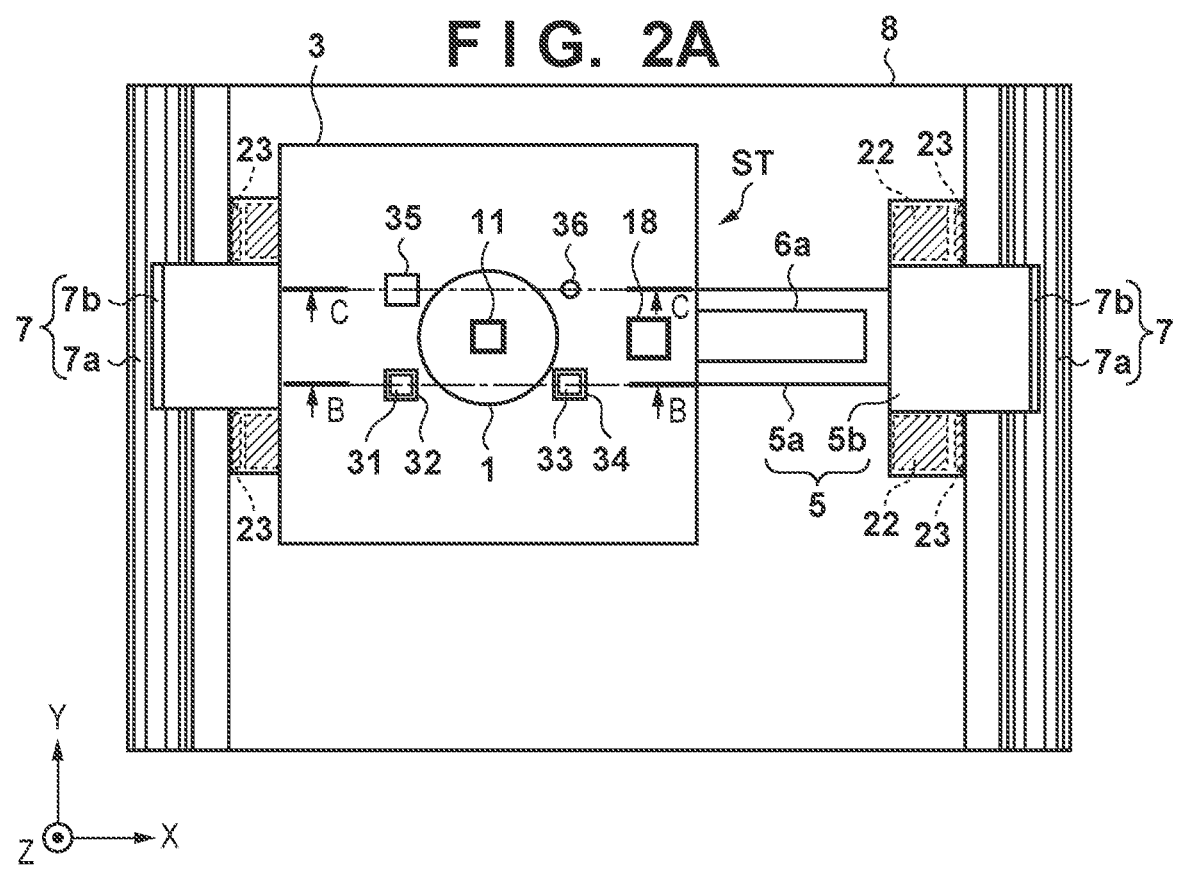
FIGS. 2A and 2B are top views of a substrate stage.
Figure 2B:
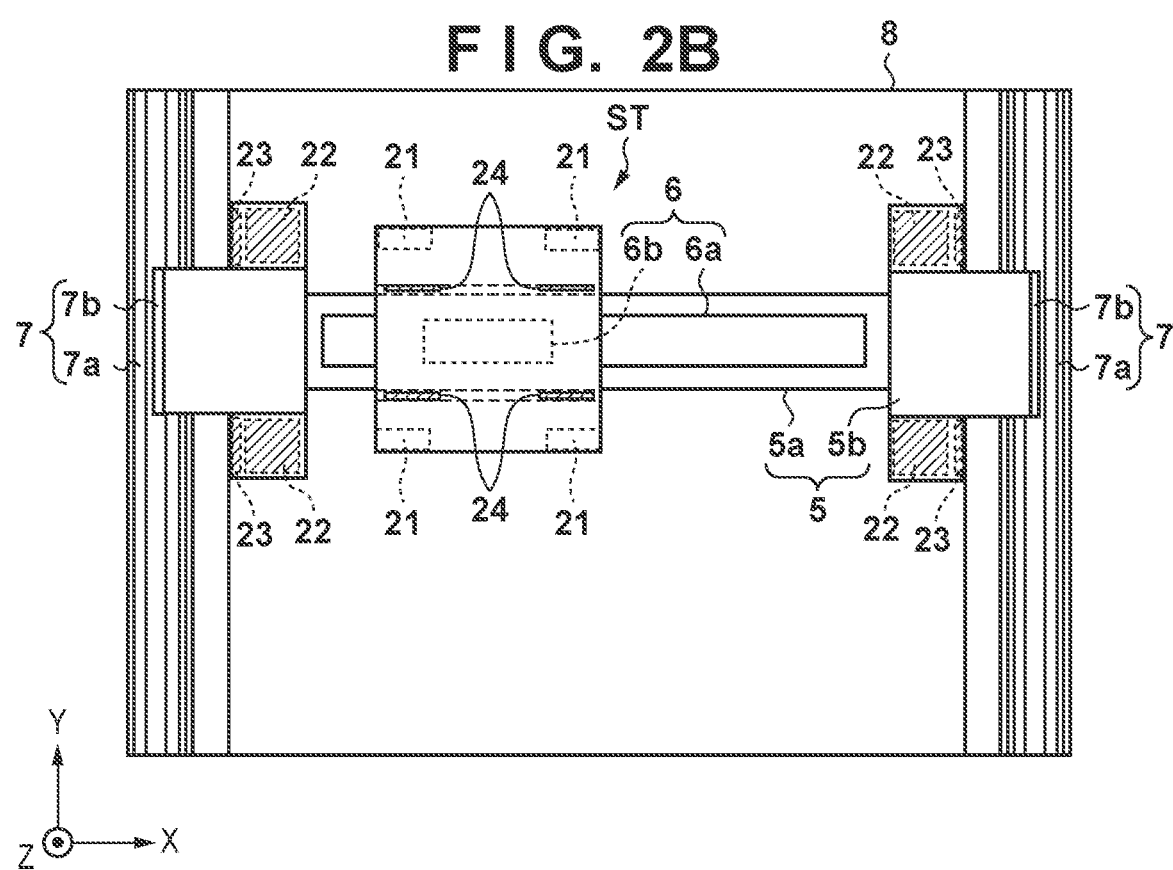
Figure 3A:
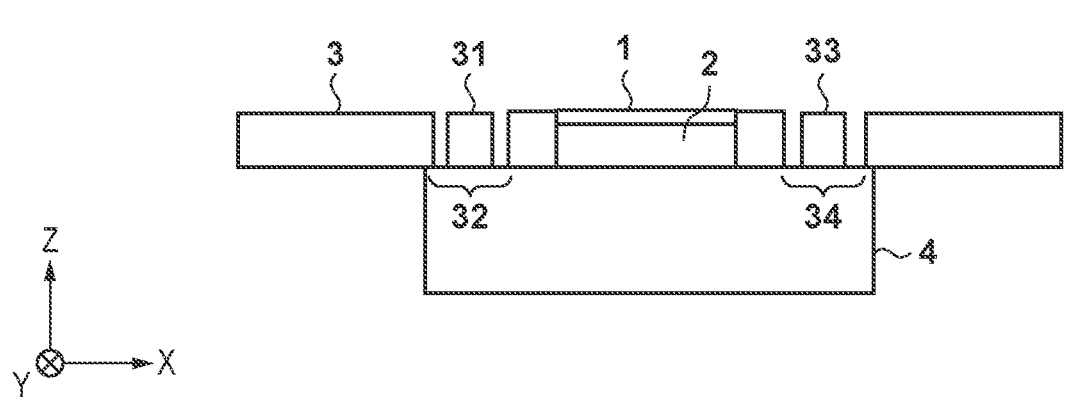
FIGS. 3A and 3B are sectional views of the substrate stage.
Figure 3B:
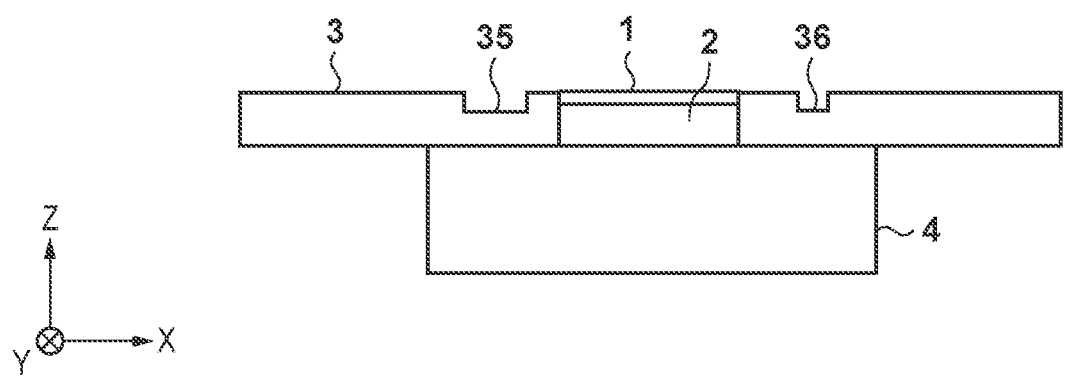

The arrangement of an imprint apparatus 100 according to this embodiment will be described. FIG. 1 is a schematic view showing the arrangement of the imprint apparatus 100 according to this embodiment. FIG. 2A is a top view of a substrate stage ST, and FIG. 2B is a top view of the substrate stage ST in a state in which a substrate chuck 2 and a surrounding member 3 are removed (that is, a sectional view taken along a line A-A in FIG. 1). FIG. 3A is a sectional view of the substrate stage ST shown in FIG. 2A taken along a line B-B, and FIG. 3B is a sectional view of the substrate stage ST shown in FIG. 2A taken along a line C-C. In the following description, directions orthogonal to each other in a plane parallel to the upper surface of the substrate 1 are defined as an X direction and a Y direction, respectively, and a direction perpendicular to the surface of the substrate 1 is defined as a Z direction. Note that the "X direction" can be defined as including the +X direction and the −X direction. This also applies to the "Y direction" and the "Z direction".

The imprint apparatus 100 according to this embodiment can include, for example, the substrate stage ST that is movable while holding a substrate 1, an imprint head IH that holds a mold 10, an irradiator 15, a first measurement device 16, a second measurement device 17, a supplier 18, and a controller 19. The controller 19 is formed by, for example, a computer including a CPU, a memory, and the like. The controller 19 controls respective units of the imprint apparatus 100, and controls an imprint process on each of a plurality of shot regions in the substrate 1.

The mold 10 is usually formed from a material capable of transmitting ultraviolet light, such as quartz. In the mold 10, a pattern having concave and convex portions to be transferred to an imprint material on a substrate is formed in a partial region (pattern region 11) on the substrate-side surface. The pattern region 11 has a mesa shape having a level difference of, for example, about several tens of μm. As the substrate 1, glass, ceramic, a metal, a semiconductor, a resin, or the like is used. A member made of a material different from that of the substrate may be formed on the surface of the substrate, as needed. More specifically, the substrate 1 is a silicon wafer, a semiconductor compound wafer, silica glass, or the like. An adhesive layer may be provided before the application of an imprint material to improve the adhesiveness between the imprint material and the substrate, as needed.

The substrate stage ST is configured to be capable of moving while holding the substrate 1. The substrate stage ST can include, for example, the substrate chuck 2 that holds the substrate 1 by vacuum holding or the like, and a movable member 4 that can support the substrate chuck 2 and move in the X and Y directions on a base 8. The movable member 4 is provided with air guides 21 each of which ejects compressed air toward the base 8 to cause the movable member 4 to float up from the base 8. With this arrangement, the movable member 4 can move in the X and Y directions along the upper surface of the base 8 while floating up from the base 8. The movable member 4 is driven by a driving mechanism DM. The driving mechanism DM can include a beam member 5, a first driver 6, and a second driver 7.

The beam member 5 is a member extending in the X direction to guide movement of the movable member 4 in the X direction, and arranged so as to go through an opening (concave portion) provided in the movable member 4. The beam member 5 can include a guide portion 5a that guides movement of the movable member 4, and support portions 5b that support the guide portion 5a in both ends (X direction) of the guide portion 5a. Each support portion 5b is provided with a mover 7b of the second driver 7 (to be described later) and air guides 22 and 23. The air guide 22 ejects compressed air toward the base 8 to cause the beam member 5 to float up from the base 8, and the air guide 23 ejects compressed air toward a stator 7a of the second driver 7 to position the beam member 5 in the X direction. Further, air guides 24 are provided in the side surfaces (the surface on the beam member 5 side) of the opening provided in the movable member 4. The air guides 24 can position the movable member 4 with respect to the beam member 5 by ejecting compressed air toward the side surfaces of the beam member 5 (guide portion 5a).

The first driver 6 drives the movable member 4 in the X direction along the beam member 5. The first driver 6 can include, for example, a linear motor formed from a stator 6a including a plurality of coils arrayed along the X direction and a mover 6b including a permanent magnet. In this embodiment, as shown in FIG. 2B, the stator 6a of the first driver 6 is provided in the beam member 5 (guide portion 5a), and the mover 6b is provided in the movable member 4. The second driver 7 drives the beam member 5 in the Y direction. The second driver 7 can include, for example, a linear motor formed from a stator 7a including a plurality of coils arrayed along the Y direction and a mover 7b including a permanent magnet. In this embodiment, the mover 7b of the second driver 7 is provided in the support portion 5b of the beam member 5.

The imprint head IH can include, for example, a mold chuck 12, a mold stage 13, and a mold driving device 14. The mold chuck 12 is supported by the mold stage 13, and holds the mold 10 by vacuum holding or the like. Each of the mold chuck 12 and the mold stage 13 is provided with an opening (not shown) which allows light from the irradiator 15 to pass therethrough. The mold stage 13 may also be provided with a sensor 20 that detects the height of the substrate 1 held by the substrate stage ST, and a load cell (not shown) that detects the pressure upon imprinting (pressing) the mold 10 against the imprint material on the substrate.

The mold driving device 14 includes an actuator for elevating the mold, and drives the mold 10 in the Z direction together with the mold chuck 12 and the mold stage 13. More specifically, the mold driving device 14 has a function of driving the mold 10 in the Z direction so as to bring the mold 10 into contact with the imprint material on the substrate or separate (release) the mold 10 from the cured imprint material. The mold driving device 14 may also have a function of correcting the inclination (posture) of the mold 10 in accordance with the substrate.

The irradiator (curing device) 15 irradiates the imprint material with light (for example, ultraviolet light) via the mold 10 in a state in which the mold 10 and the imprint material on the substrate are in contact with each other, thereby curing the imprint material. The irradiator 15 can include, for example, a light source and an optical system (collimator lens and the like) that shapes light emitted from the light source.

The first measurement device 16 can include, for example, a TTM (Through The Mold) scope provided on the mold stage 13. More specifically, the first measurement device 16 includes an optical system and an imaging system used to detect, via an alignment mark provided on the mold 10, a reference mark provided on the substrate stage ST (surrounding member 3) and/or an alignment mark provided on the substrate 1. Based on a detection result of the TTM scope, the first measurement device 16 measures the relative position between the mold 1 and the substrate 1 (each shot region) in the X and Y directions and/or the relative position between the mold 10 and the substrate stage ST.

The second measurement device 17 can include an off-axis scope including an optical system and an imaging system used to detect, without via the mold 10, the reference mark provided on the substrate stage ST (surrounding member 3) and/or the alignment mark provided on the substrate 1. Based on a detection result of the off-axis scope, the second measurement device 17 measures the relative position between the mold 10 and the substrate 1 (each shot region) in the X and Y directions and/or the relative position between the mold 10 and the substrate stage ST. Thus, the controller 19 can control alignment between the mold 10 and the substrate 1 based on the measurement result of the first measurement device 16 and/or the measurement result of the second measurement device 17.

The supplier 18 includes a dispenser including a discharge outlet that discharges (dispenses) an imprint material (for example, a photo-curable resin), and supplies the imprint material onto a substrate by causing the dispenser to discharge (drop) the imprint material. The supplier 18 (dispenser) employs, for example, a piezo jet method, a micro solenoid method, or the like, and discharges the imprint material as a plurality of droplets each having a small volume while the substrate 1 is moved by the substrate stage ST in the X and Y directions. Thus, the supplier 18 can supply the imprint material onto the substrate (onto each shot region).

Here, in the imprint apparatus 100 according to this embodiment, the surrounding member 3 is provided around the substrate chuck 2 (the holding region of the substrate 1). The surrounding member 3 is also referred to as a purge plate or a flush plate. The surrounding member 3 is supported by the movable member 4, and the position of the surrounding member 3 in the Z-axis direction is adjusted such that the upper surface of the surrounding member 3 is flush with the upper surface of the substrate 1. By providing the surrounding member 3, it is possible to uniformize the concentration of a filling promotion gas (for example, helium) which is supplied between the mold 10 and the substrate 1 to improve the fillability of the imprint material into the pattern having concave and convex portions of the mold 10. Further, by providing the surrounding member 3, it is possible to decrease a gap formed around the substrate 1 below the mold 10. Therefore, it is possible to make it difficult for particles to enter between the mold 10 and the substrate 1 from the external space, and this can reduce adhesion of the particles to the pattern region 11 of the mold 10.

A plurality of functional components are provided in the upper surface of the surrounding member 3. In this embodiment, for example, a sensor 33, a receptor 35, and a reference mark are provided as the functional components in the upper surface of the surrounding member 3.

The sensor 33 is an illuminance meter that detects the illuminance of curing light emitted from the irradiator 15 to cure the imprint material. As shown in FIG. 3A, the sensor 33 is arranged inside an opening 34 formed in the upper surface of the surrounding member 3 such that the upper surface of the sensor 33 is flush with the upper surface of the substrate 1. With this arrangement, it is possible to accurately measure the illuminance of the curing light at the same height as the substrate 1. The receptor 35 is a saucer for receiving the imprint material preliminarily discharged from the supplier 18 (dispenser) and, as shown in FIG. 3B, can be formed by a step (concave portion) formed in the upper surface of the surrounding member 3. By periodically performing preliminary discharge of discharging the imprint material from the supplier 18 to the receptor 35 of the surrounding member 3, the imprint material can be stably discharged from the supplier 18 during the imprint process on the substrate 1.

The reference mark is a mark for detecting the position of the substrate stage ST, and can include a first reference mark 31 (first mark) and a second reference mark 36 (second mark). The first reference mark 31 is a mark used to detect the position of the substrate stage ST with respect to the mold 10. As shown in FIG. 3A, the first reference mark 31 is arranged inside an opening 32 formed in the upper surface of the surrounding member 3 such that the upper surface of the first reference mark 31 is flush with the upper surface of the substrate 1. By detecting the first reference mark 31 by the first measurement device 16 and/or the second measurement device 17, the position of the substrate stage ST with reference to the mold 10 can be accurately detected. The second reference mark 36 is a mark used to detect the position of the substrate stage ST with respect to a substrate conveyance mechanism (not shown) that conveys the substrate 1. As shown in FIG. 3B, the second reference mark 36 can be formed by a step (concave portion) formed in the upper surface of the surrounding member 3. By detecting the second reference mark 36 by a camera provided in the substrate conveyance mechanism or the like, the position of the substrate stage ST with respect to the substrate conveyance mechanism can be accurately detected.

[Imprint Process]

Figure 4:
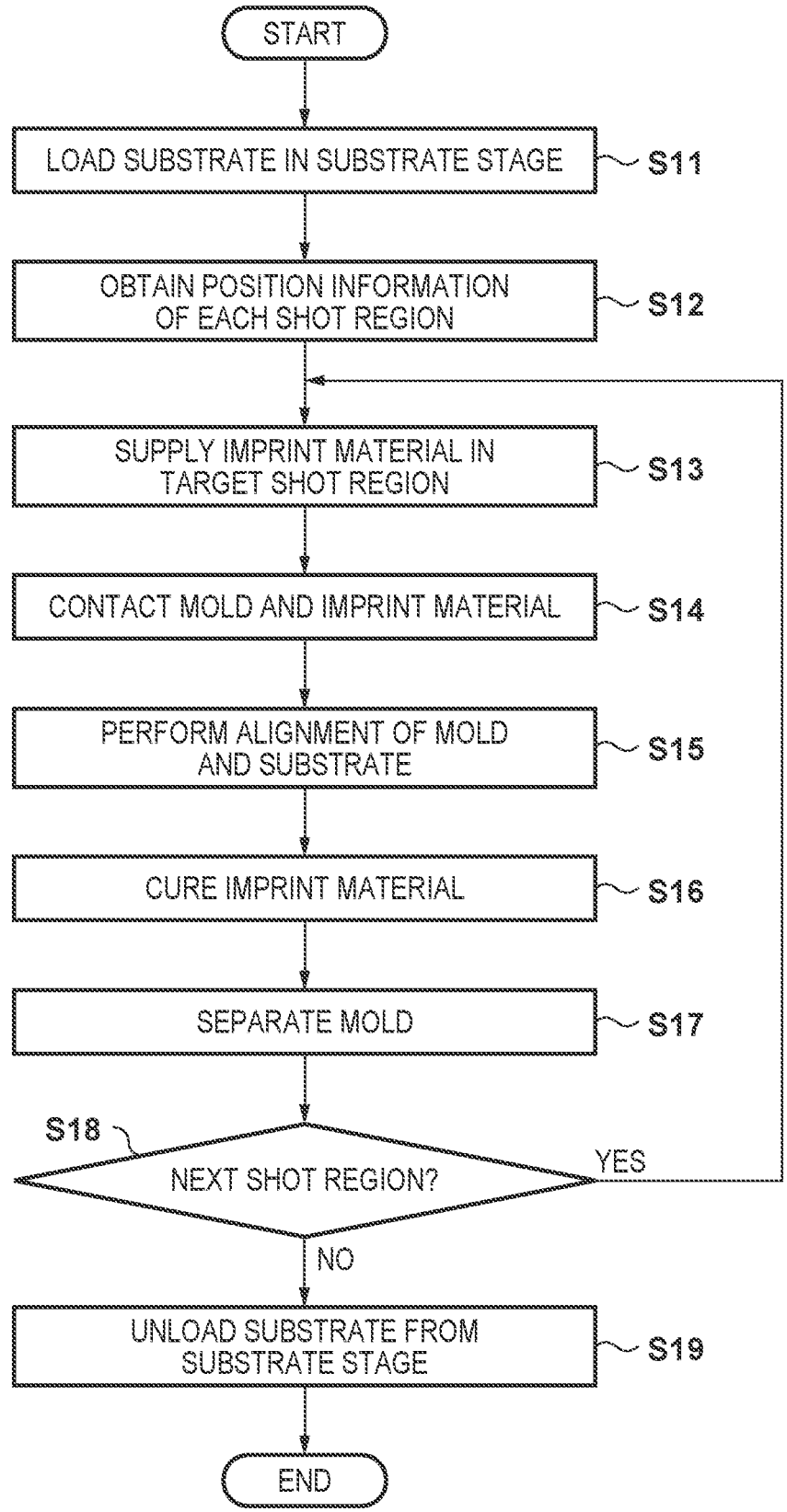
FIG. 4 is a flowchart illustrating an imprint process.

An imprint process executed by the above-described imprint apparatus 100 according to this embodiment will be described. FIG. 4 is a flowchart illustrating the imprint process according to this embodiment. Respective steps of the flowchart illustrated in FIG. 4 can be controlled by the controller 19.

In step S11, the controller 19 uses the substrate conveyance mechanism (not shown) to load the substrate 1 onto the substrate chuck 2 of the substrate stage ST, and controls the substrate chuck 2 to hold the substrate 1. At this time, the controller 19 can perform stable conveyance of the substrate 1 by causing the camera of the substrate conveyance mechanism or the like to detect the second reference mark 36 of the substrate stage ST (surrounding member 3) to check the position of the substrate stage ST with respect to the substrate conveyance mechanism.

In step S12, the controller 19 causes the second measurement device 17 to measure the position of the mark (alignment mark) provided in each shot region of the substrate 1 to obtain the position information of each shot region of the substrate 1 with respect to the substrate stage ST. The controller 19 may obtain the position information by causing the second measurement device 17 to measure the mark positions of all the shot regions in the substrate 1, or may obtain the position information by causing the second measurement device 17 to measure the mark positions of some sample shot regions. Based on each mark position measured by the second measurement device 17, the controller 19 may obtain information concerning the shape and posture (orientation) of each shot region. Here, in a stage before the imprint process, the controller 19 preferably causes the second measurement device 17 to detect the first reference mark 31 of the substrate stage ST (surrounding member 3). With this processing, the position of the substrate stage ST with respect to the second measurement device 17 can be grasped (checked), so that the position information of each mark of the substrate 1 with respect to the substrate stage ST can be accurately obtained.

In step S13, the controller 19 causes the supplier 18 to supply the imprint material onto a target shot region of the imprint process among the plurality of shot regions in the substrate 1. For example, the controller 19 causes the substrate stage ST to move the substrate 1 such that the target shot region is arranged below the supplier 18, and then causes the supplier 18 to discharge the imprint material while relatively moving the supplier 18 and the substrate 1. With this processing, the imprint material can be supplied onto the target shot region.

In step S14, the controller 19 brings the pattern region 11 of the mold 10 into contact with the imprint material on the target shot region of the substrate 1. For example, based on the position information of each shot region obtained in step S12, the controller 19 causes the substrate stage ST to move the substrate 1 such that the target shot region is arranged below the mold 10 (pattern region 11). Then, the controller 19 causes the imprint head IH (mold driving device 14) to drive the mold 10 in the −Z direction to decrease the spacing between the mold 10 and the substrate 1, thereby bringing the pattern region 11 of the mold 10 into contact with the imprint material on the target shot region. Here, the controller 19 may cause the first measurement device 16 to detect the first reference mark 31 of the substrate stage ST (surrounding member 3) in the stage before the imprint process. With this processing, the position of the substrate stage ST with respect to the imprint head IH (mold 10) can be grasped (checked), so that the target shot region of the substrate 1 can be accurately arranged below the pattern region 11 of the mold 10.

In step S15, the controller 19 performs alignment between the pattern region 11 of the mold 10 and the target shot region of the substrate 1. For example, the controller 19 causes the first measurement device 16 to measure the relative position between the alignment mark provided in the pattern region 11 of the mold 10 and an alignment mark provided in the target shot region of the substrate 1. Then, the controller 19 performs alignment between the pattern region 11 of the mold 10 and the target shot region of the substrate 1 such that the relative position measured by the first measurement device 16 matches a target relative position.

In step S16, the controller 19 causes the irradiator 15 to irradiate the imprint material with curing light to cure the imprint material in a state in which the pattern region 11 of the mold 10 and the imprint material on the target shot region of the substrate 1 are in contact with each other. Here, in the stage before the imprint process, the controller 19 preferably causes the sensor 33 of the substrate stage ST (surrounding member 3) to measure the irradiation intensity and irradiation distribution of the curing light from the irradiator 15 while moving the substrate stage ST. With this processing, the irradiation light amount of the curing light to the imprint material can be accurately controlled based on the measurement result of the sensor 33.

In step S17, the controller 19 causes the imprint head IH (mold driving device 14) to drive the mold 10 in the +Z direction to increase the spacing between the mold 10 and the substrate 1 and separate the mold 10 from the cured imprint material (separation processing). With this processing, the pattern having concave and convex portions formed in the pattern region 11 of the mold 10 is transferred to the imprint material on the target shot region of the substrate 1, so that a pattern of the imprint material can be formed on the target shot region.

In step S18, the controller 19 determines whether there is a shot region (next shot region) to undergo the imprint process next in the substrate 1. If there is a next shot region, the process advances to step S13. If there is no next shot region, the process advances to step S19. In step S19, the controller 19 uses the substrate conveyance mechanism (not shown) to unload the substrate 1 from the substrate chuck 2 of the substrate stage ST.

[Removal of Particles]

Figure 5A:
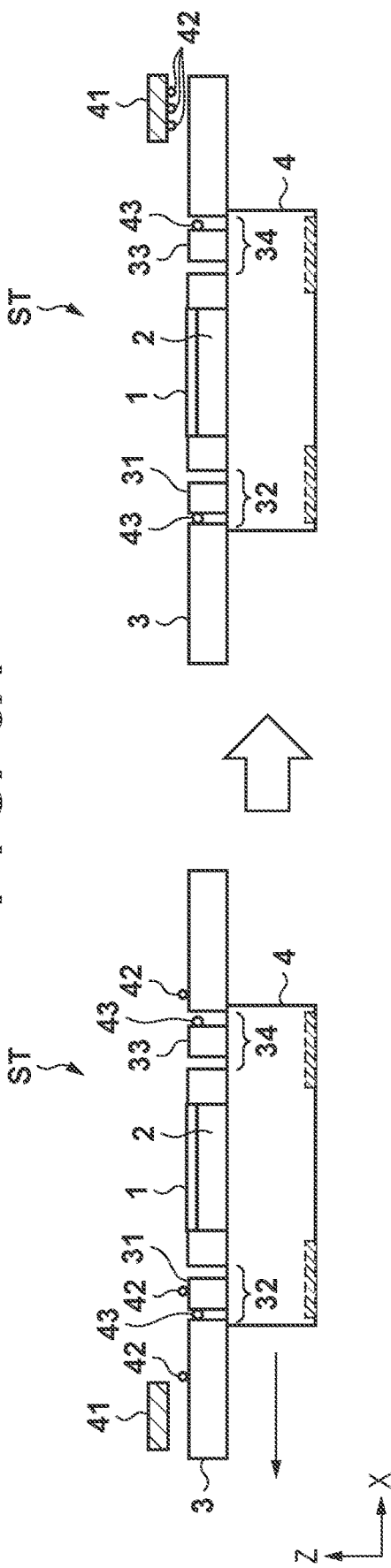
FIGS. 5A and 5B are views showing execution of a cleaning process.
Figure 5B:
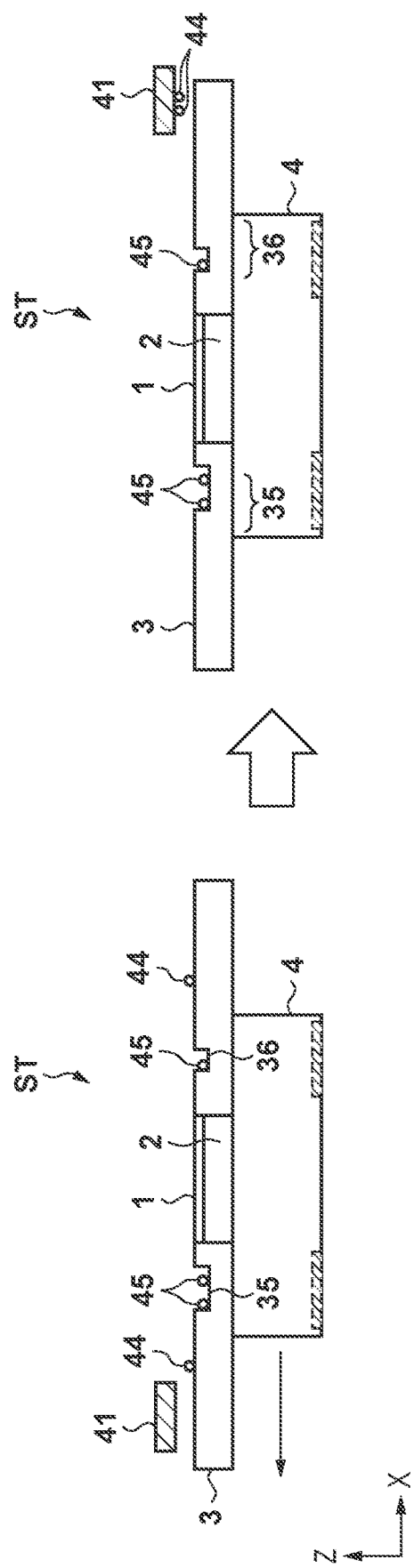

In order to stably execute the imprint process in the imprint apparatus 100, it is preferable to reduce adhesion of particles to the substrate 1 and the pattern region 11 of the mold 10. Therefore, in the imprint apparatus 100, a cleaning process for removing particles on the substrate stage ST is periodically executed. In the cleaning process, as an example, a collector 41 (collection surface) is provided around the mold 10, and the collector 41 and the substrate stage ST are relatively moved in a state in which the collector 41 and the upper surface of the substrate stage ST face each other as shown in FIGS. 5A and 5B. The collector 41 is supplied with an electric potential for generating an electric field between the collector 41 and the substrate stage ST (surrounding member 3), and this electric field enables the collector 41 to suck and collect the particles on the substrate stage ST.

FIG. 5A is a sectional view taken along the line B-B in FIG. 2A, and shows the cleaning process executed by moving the collector 41 on a path including the first reference mark 31 and the sensor 33 in the surrounding member 3. The left view in FIG. 5A shows a stage before the cleaning process is executed by the collector 41, and particles 42 exist on the upper surface of the surrounding member 3. In addition, since the first reference mark 31 and the sensor 33 are arranged inside the openings 32 and 34, respectively, formed in the upper surface of the surrounding member 3, particles 43 exist in a gap between the first reference mark 31 and the opening 32 and a gap between the sensor 33 and the opening 34. By driving the substrate stage ST in the arrow direction to relatively move the collector 41 with respect to the upper surface of the substrate stage ST (surrounding member 3), the cleaning process of the upper surface of the surrounding member 3 can be executed.

The right view in FIG. 5A shows a stage after the cleaning process is executed by the collector 41. The particles 42 existing on the upper surface of the surrounding member 3 can be collected by the collector 41 since the distance between each particle 42 and the collector 41 is small. On the other hand, it is difficult to collect, by the collection surface 41, the particles 43 existing in the gaps in the openings 32 and 34 where the first reference mark 31 and the sensor 33 are arranged, respectively, since the distance between each particle 43 and the collector 41 is large so the collector 41 cannot obtain a sufficient attraction force. Since the collector 41 attracts the particles using the electric field, as the distance to the particle increases, the attraction force decreases in inverse proportion to the square of the distance. Due to the decrease in attraction force depending on the distance, the particles 43 remain in the gap between the first reference mark 31 and the opening 32 and the gap between the sensor 33 and the opening 34.

Similarly, FIG. 5B is a sectional view taken along the line C-C in FIG. 2A, and shows the cleaning process executed by moving the collector 41 on a path including the receptor 35 and the second reference mark 36 in the surrounding member 3. The left view in FIG. 5B shows a stage before the cleaning process is executed by the collector 41. Particles 44 exist on the upper surface of the surrounding member 3, and particles 45 exist in the step (concave portion) forming the receptor 35 and the step (concave portion) forming the second reference mark 36. By driving the substrate stage ST in the arrow direction to relatively move the collector 41 with respect to the upper surface of the substrate stage ST (surrounding member 3), the cleaning process of the upper surface of the surrounding member 3 can be executed.

The right view in FIG. 5B shows a stage after the cleaning process is executed by the collector 41. The particles 44 existing on the upper surface of the surrounding member 3 can be collected by the collector 41. On the other hand, it is difficult to collect, by the collector 41, the particles 45 existing in the receptor 35 and the second reference mark 36 since each of the receptor 35 and the second reference mark 36 is formed by the step (concave portion) formed in the upper surface of the surrounding member 3 so that the distance between each particle 45 and the collector 41 is large. Particularly, the particle 45 adhering to a corner portion of the step (concave portion) forming each of the receptor 35 and the second reference mark 36 adheres to two surfaces, it can be more difficult to collect it by the collection surface 41.

As has been described above, the cleaning process using the collector 41 cannot completely remove the particles existing in the gap between the first reference mark 31 and the opening 32, the gap between the sensor 33 and the opening 34, and the steps (concave portions) forming the receptor 35 and the second reference mark 36, and the particles tend to remain therein. Here, in the example described above, the cleaning method has been described in which an electrostatic force is generated in the collector 41, but a cleaning method in which an air suction force or a magnetic force is generated in the collector 41 may be used. In either method, a similar result is obtained since the collection ability decreases in accordance with the distance between the collector 41 and the particle. Also in a cleaning method of wiping off particles on the surrounding member 3 using a wiper or the like, it is difficult to wipe the gaps and steps (concave portions) of the surrounding member 3.

In the imprint process according to this embodiment, when the mold 10 is separated from the cured imprint material on the substrate in step S17, the mold 10 can be charged (this is referred to as separation charging). Accordingly, the particles 43 and 45 that cannot be collected by the collector 41 in the cleaning process and remain in the surrounding member 3 may adhere to the pattern region 11 when the pattern region 11 of the mold 10 charged by separation charging passes above. Further, since the substrate stage ST is driven in the X and Y directions by acceleration/deceleration, an inertial force is applied to the particles 43 and 45 by the acceleration/deceleration speed during the driving of the stage, so that the particles 43 and 45 are more likely to adhere to the pattern region 11 of the mold 10 charged by separation charging. This also applies to a case in which a gas flow is formed, by a gas supplier (not shown), below the mold 10 charged by separation charging. The gas flow formed by the gas supplier applies a force to the particles 43 and 45, so that the particles 43 and 45 are more likely to adhere to the pattern region 11 of the mold 10 charged by separation charging.

To prevent this, the controller 19 according to this embodiment controls movement of the substrate stage ST in the imprint process such that the particles that cannot be completely removed in the cleaning process and remain in the surrounding member 3 are prevented from adhering to the pattern region 11 of the mold 10. More specifically, the controller 19 controls movement of the substrate stage ST in the imprint process so as to prevent at least one of the sensor 33, the receptor 35, the first reference mark 31, and the second reference mark 36 from passing below the pattern region 11 of the mold 10. Movement of the substrate stage ST in the imprint process includes movement of the substrate stage ST between a position below the supplier 18 (dispenser) and a position below the mold 10 (pattern region 11). In the following description, movement control of the substrate stage ST in the imprint process according to this embodiment will be described in comparison with movement control of the substrate stage ST in a conventional imprint process.

[Conventional Movement Control of Substrate Stage]

Figure 6A:
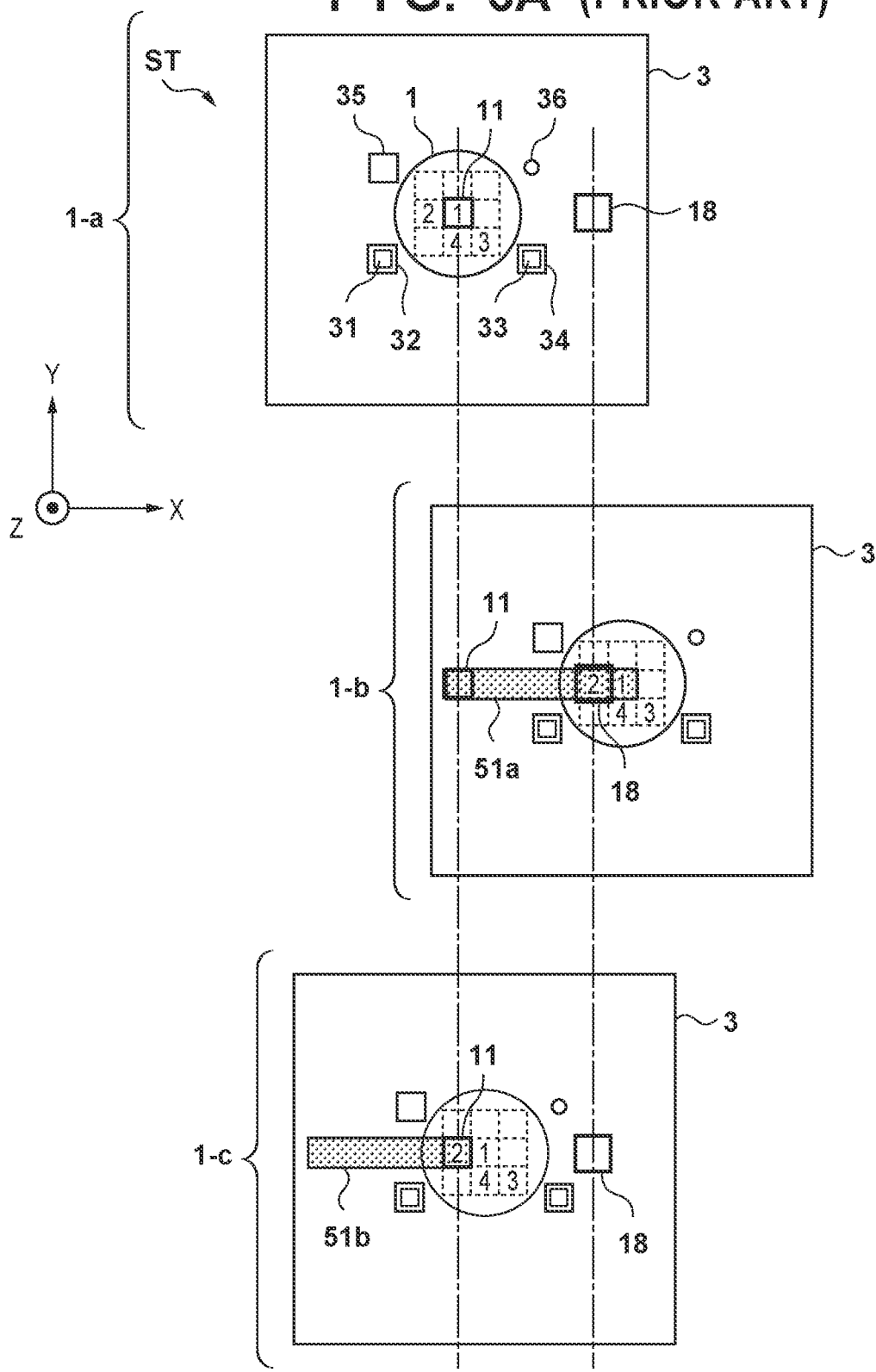
FIGS. 6A to 6C are views showing an example of movement control of the substrate stage in a conventional imprint process.
Figure 6B:
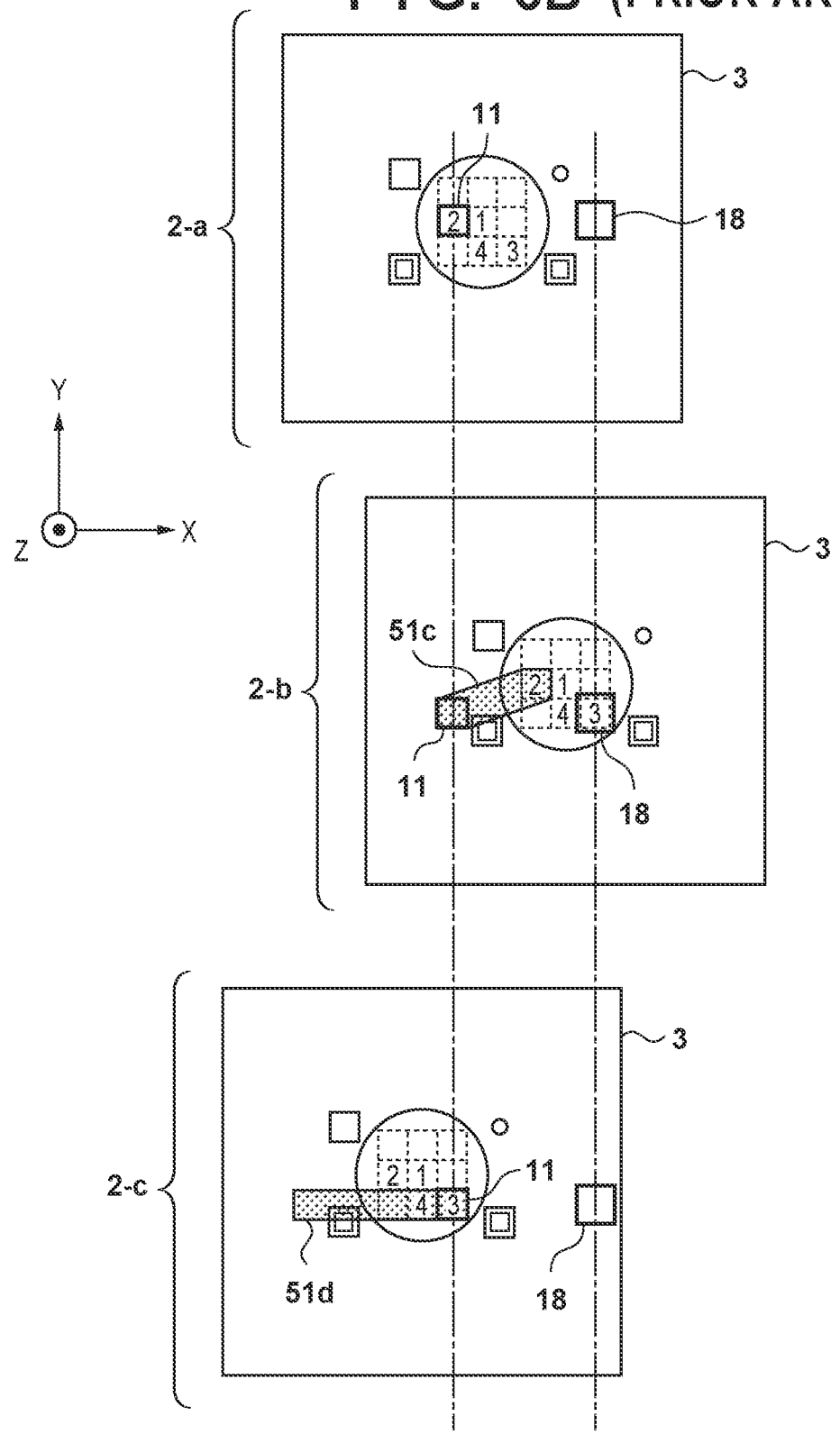
Figure 6C:
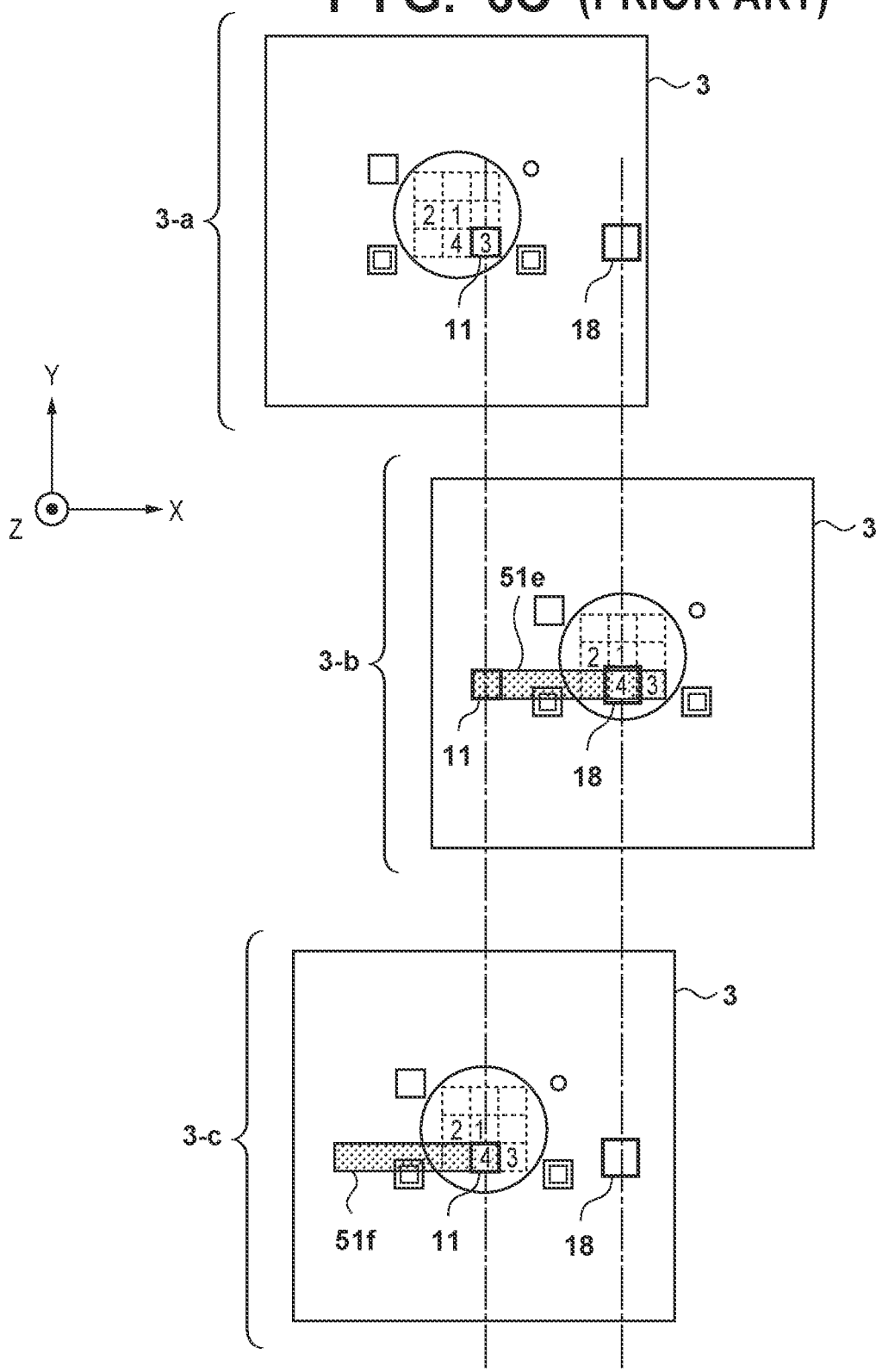

First, movement control of the substrate stage ST in the conventional imprint process will be described. FIGS. 6A to 6C are views each showing the substrate 1 and the surrounding member 3 when viewed from above (+Z direction side), and show an example of movement control of the substrate stage ST in the conventional imprint process. FIGS. 6A to 6C show an example of executing the imprint process sequentially on shot regions Sh1 to Sh4 of the plurality of shot regions in the substrate 1, and each of FIGS. 6A to 6C also shows the position of the pattern region 11 of the mold 10 and the position of the supplier 18 (dispenser). Note that in FIGS. 6A to 6C, the shot regions Sh1 to Sh4 in the substrate 1 are simply indicated by numbers.

A state 1-$a$ in FIG. 6A shows a stage in which the imprint process (separation processing) on the shot region Sh1 is completed and the mold 10 (pattern region 11) is charged by separation charging. Then, as shown in a state 1-$b$ in FIG. 6A, in order to supply the imprint material onto the shot region Sh2 by the supplier 18, the substrate stage ST is moved so as to arrange the shot region Sh2 below the supplier 18. A passing region 51$a$ of the upper surface of the substrate stage ST that passes below the pattern region 11 of the mold 10 during the movement of the substrate stage ST is shown in the state 1-$b$ in FIG. 6A. The passing region 51$a$ is a flat surface that does not include the sensor 33, the receptor 35, the first reference mark 31, and the second reference mark 36 where the gaps and steps (concave portions) are generated in which the particles tend to remain. The particles have been removed from the passing region 51$a$ by the cleaning process in advance. Therefore, the particles are less likely to adhere to the pattern region 11 of the mold 10 during the movement of the substrate stage ST in this step.

After the imprint material is supplied onto the shot region Sh2, the substrate stage ST is moved so as to arrange the shot region Sh2 below the pattern region 11 of the mold 10 as shown in a state 1-c in FIG. 6A. A passing region 51b of the upper surface of the substrate stage ST that passes below the pattern region 11 of the mold 10 during the movement of the substrate stage ST is shown in the state 1-c in FIG. 6A. Similar to the passing region 51a, the passing region 51b is also a flat surface that does not include the sensor 33 and the like, and the particles have been removed from the passing region 51b by the cleaning process in advance. Therefore, the particles are less likely to adhere to the pattern region 11 of the mold 10 during the movement of the substrate stage ST in this step.

A state 2-a in FIG. 6B shows a stage in which the imprint process (separation processing) on the shot region Sh2 is completed. Then, as shown in a state 2-b in FIG. 6B, in order to supply the imprint material onto the shot region Sh3 by the supplier 18, the substrate stage ST is moved so as to arrange the shot region Sh3 below the supplier 18. A passing region 51c of the upper surface of the substrate stage ST that passes below the pattern region 11 of the mold 10 during the movement of the substrate stage ST is shown in the state 2-b in FIG. 6B. After the imprint material is supplied onto the shot region Sh3, the substrate stage ST is moved so as to arrange the shot region Sh3 below the pattern region 11 of the mold 10 as shown in a state 2-c in FIG. 6B. A passing region 51d of the upper surface of the substrate stage ST that passes below the pattern region 11 of the mold 10 during the movement of the substrate stage ST is shown in the state 2-c in FIG. 6B. Both the passing regions 51c and 51d include the first reference mark 31 where the gap is generated in which the particles tend to remain, so that the particles are likely to adhere to the pattern region 11 of the mold 10.

Similarly, a state 3-a in FIG. 6C shows a stage in which the imprint process (separation processing) on the shot region Sh3 is completed. Then, as shown in a state 3-b in FIG. 6C, in order to supply the imprint material onto the shot region Sh4 by the supplier 18, the substrate stage ST is moved so as to arrange the shot region Sh4 below the supplier 18. A passing region 51e of the upper surface of the substrate stage ST that passes below the pattern region 11 of the mold 10 during the movement of the substrate stage ST is shown in the state 3-b in FIG. 6C. After the imprint material is supplied onto the shot region Sh4, the substrate stage ST is moved so as to arrange the shot region Sh4 below the pattern region 11 of the mold 10 as shown in a state 3-c in FIG. 6C. A passing region 51f of the upper surface of the substrate stage ST that passes below the pattern region 11 of the mold 10 during the movement of the substrate stage ST is shown in the state 3-c in FIG. 6C. Both the passing regions 51e and 51f include the first reference mark 31 where the gap is generated in which the particles tend to remain, so that the particles are likely to adhere to the pattern region 11 of the mold 10 during the movement of the substrate stage ST.

Movement Control of Substrate Stage in this Embodiment

Figure 7A:
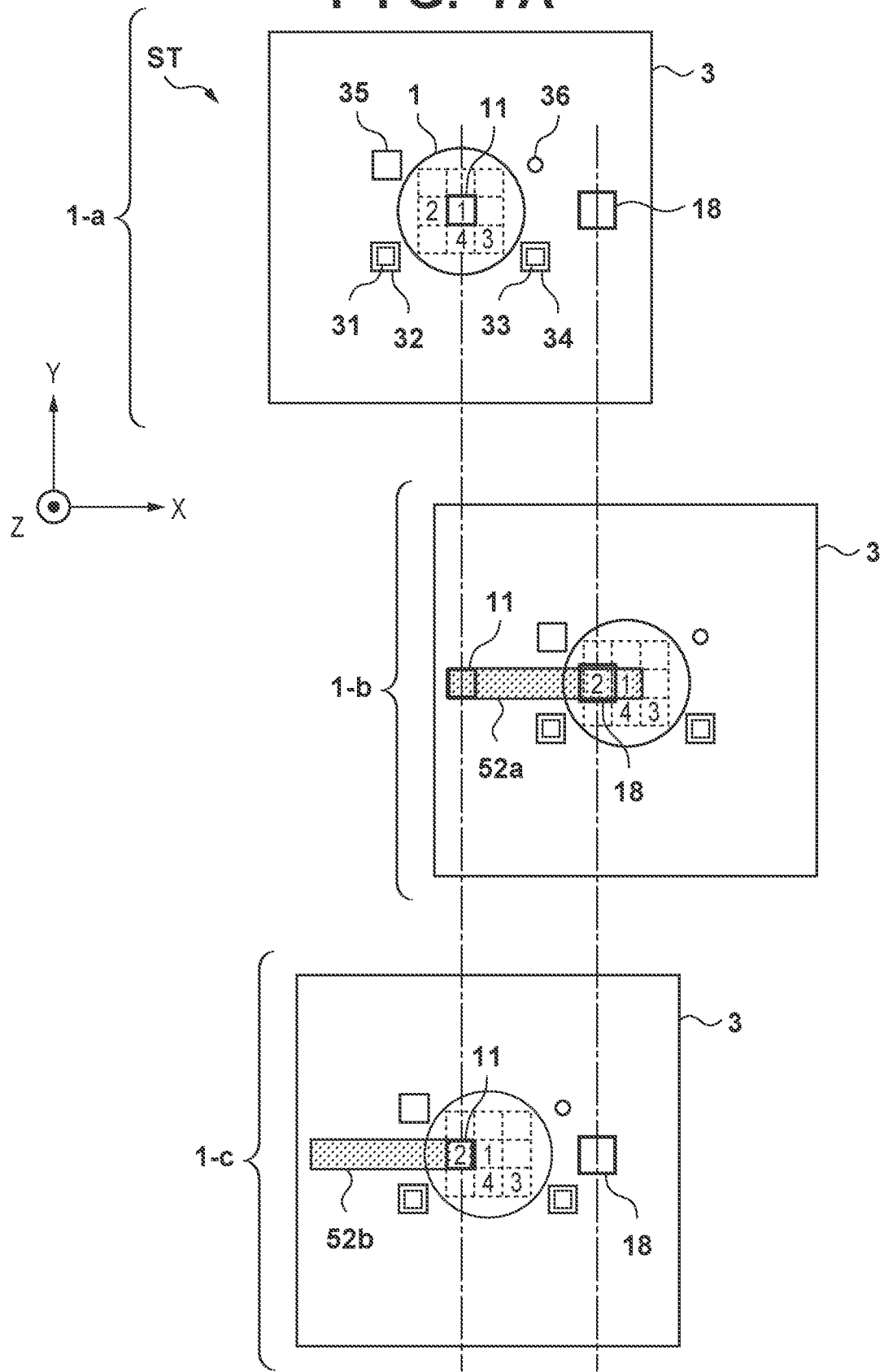
FIGS. 7A to 7C are views showing an example of movement control of the substrate stage in an imprint process according to the first embodiment.
Figure 7B:
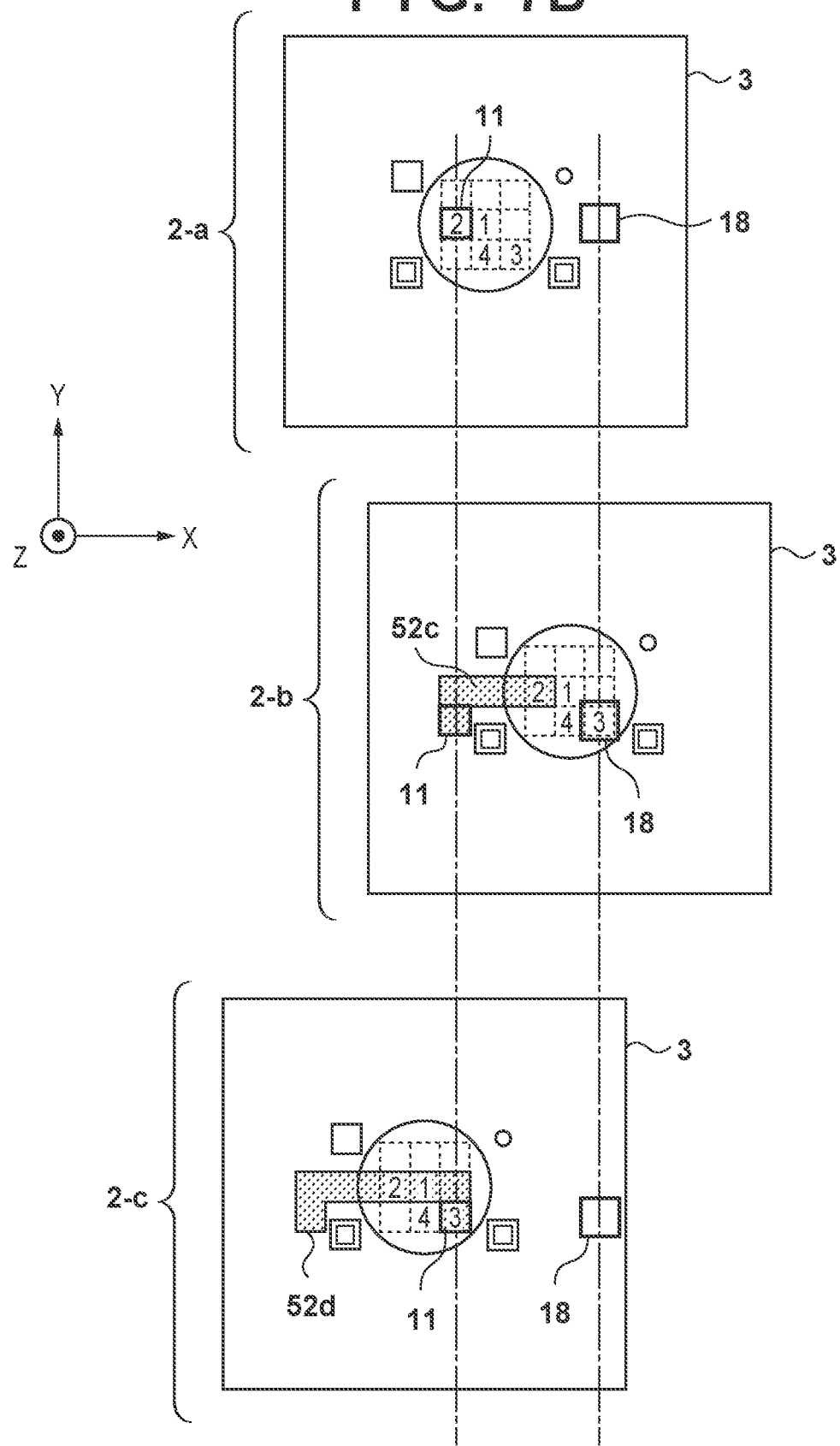
Figure 7C:
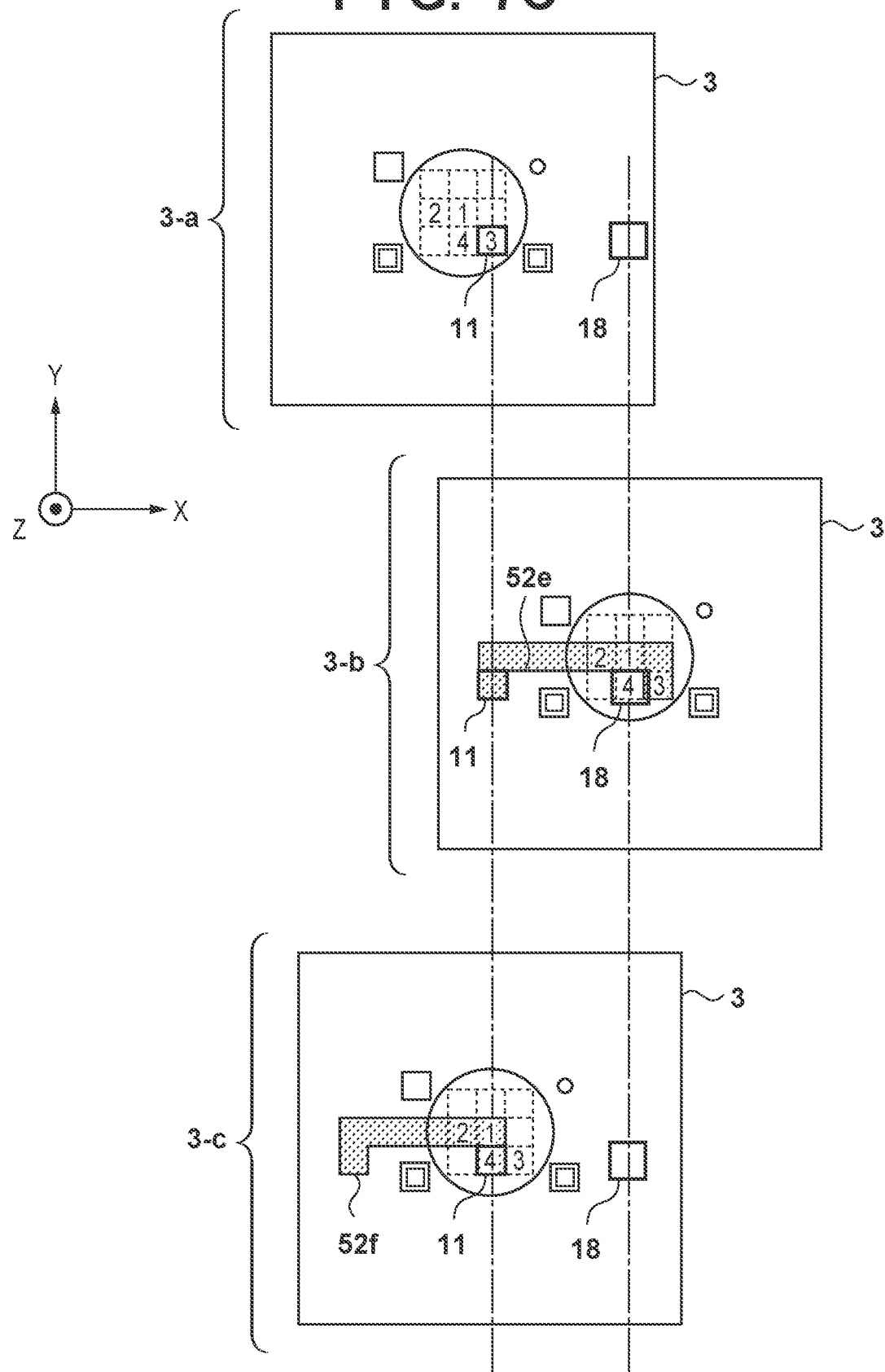

Next, movement control of the substrate stage ST in the imprint process according to this embodiment will be described. FIGS. 7A to 7C are views each showing the substrate 1 and the surrounding member 3 when viewed from above (+Z direction side), and show an example of movement control of the substrate stage ST in the imprint process according to this embodiment. As in FIGS. 6A to 6C, FIGS. 7A to 7C show an example of executing the imprint process sequentially on the shot regions Sh1 to Sh4 of the plurality of shot regions in the substrate 1, and each of FIGS. 7A to 7C also shows the position of the pattern region 11 of the mold 10 and the position of the supplier 18 (dispenser). Note that the states 1-a to 3-c shown in FIGS. 7A to 7C correspond to the states 1-a to 3-c shown in FIGS. 6A to 6C, respectively. Further, as in FIGS. 6A to 6C, the shot regions Sh1 to Sh4 in the substrate 1 are simply indicated by numbers in FIGS. 7A to 7C.

FIGS. 7A to 7C show passing regions 52a to 52f of the upper surface of the substrate stage ST, each of which passes below the pattern region 11 of the mold 10 during the movement of the substrate stage ST. The moving path of the substrate stage ST between a position below the supplier 18 and a position below the mold 10 in the movement control of the substrate stage ST according to this embodiment (FIGS. 7A to 7C) is different from that in the conventional movement control of the substrate stage ST (FIGS. 6A to 6C). That is, in the imprint process according to this embodiment, the movement of the substrate stage ST is controlled so as to prevent at least one of the sensor 33, the receptor 35, the first reference mark 31, and the second reference mark 36 from passing below the pattern region 11 of the mold 10.

The states 1-a to 1-c in FIG. 7A show a step of moving the substrate stage ST to supply the imprint material onto the shot region Sh2 by the supplier 18 after the imprint process (separation processing) on the shot region Sh1 is completed. The states 1-b and 1-c in FIG. 7A show passing regions 52a and 52b, respectively, of the upper surface of the substrate stage ST each of which passes below the pattern region 11 of the mold 10 during the movement of the substrate stage ST. Neither the passing region 51a nor 51b includes the sensor 33 and the like where the gap or the step is generated in which the particles tend to remain, so that the particles are less likely to adhere to the pattern region 11 of the mold 10 during the movement of the substrate stage ST.

The states 2-a to 2-c in FIG. 7B show a step of moving the substrate stage ST to supply the imprint material onto the shot region Sh3 by the supplier 18 after the imprint process (separation processing) on the shot region Sh2 is completed. In this step, if the substrate stage ST is moved as in the conventional imprint process shown in the states 2-a to 2-c in FIG. 6B, the particles are likely to adhere to the pattern region 11 of the mold 10 as described above. Therefore, in the imprint process according to this embodiment, the movement of the substrate stage ST is controlled so as to prevent the sensor 33 and the like from passing below the pattern region 11 of the mold 10.

For example, the controller 19 determines the moving path of the substrate stage ST between a position below the supplier 18 and a position below the of the mold 10 so as to prevent the sensor 33 and the like from passing below the pattern region 11 of the mold 10. Then, the movement of the substrate stage ST can be controlled in accordance with the determined moving path. In this case, the controller 19 determines whether the sensor 33 and the like pass below the pattern region 11 of the mold 10 if the substrate stage ST is moved between the position below the supplier 18 and the position below the mold 10 in a shortest path as in the conventional imprint process. If it is determined that the sensor 33 and the like pass below the pattern region 11 in the shortest path, the controller 19 can determine the moving path of the substrate stage ST for preventing the sensor 33 and the like from passing below the pattern region 11.

When the shot region Sh3 is arranged below the supplier 18, the substrate stage ST is moved in the +X direction and then moved in the +Y direction as indicated by the passing region 52c in the state 2-b in FIG. 7B. When the shot region Sh3 is arranged below the pattern region 11 of the mold 10, the substrate stage ST is moved in the −Y direction, moved in the +X direction, and then moved in the −Y direction as indicated by the passing region 52d in the state 2-c in FIG. 7B. By moving the substrate stage ST as described above, it is possible to prevent the sensor 33 and the like from passing below the pattern region 11 of the mold 10, so that the possibility of the particles adhering to the pattern region 11 can be reduced.

The states 3-a to 3-c in FIG. 7C show a step of moving the substrate stage ST to supply the imprint material onto the shot region Sh4 by the supplier 18 after the imprint process (separation processing) on the shot region Sh3 is completed. Also in this step, as indicated by the passing regions 52e and 52f, the movement of the substrate stage ST is controlled so as to prevent the sensor 33 and the like from passing below the pattern region 11 of the mold 10. With this processing, the possibility of the particles adhering to the pattern region 11 can be reduced.

Each of FIGS. 8A and 8B shows a cumulative result (to be sometimes referred to as a cumulative passing region hereinafter) of the passing regions of the upper surface of the substrate stage ST having passed below the pattern region 11 of the mold 10 in the imprint process performed on the plurality of shot regions. FIG. 8A shows a cumulative passing region 51 in the conventional imprint process, and FIG. 8B shows a cumulative passing region 52 in the imprint process according to this embodiment. In the conventional imprint process shown in FIG. 8A, since the first reference mark 31 and the receptor 35 are included in the cumulative passing region 51, the particles are likely to adhere to the pattern region 11 of the mold 10. On the other hand, in the imprint process according to this embodiment shown in FIG. 8B, since the sensor 33 and the like are not included in the cumulative passing region 52, the possibility of the particles adhering to the pattern region 11 of the mold 10 can be reduced.

As has been described above, the imprint apparatus 100 according to this embodiment controls the movement of the substrate stage ST between the position below the supplier 18 and the position below the mold 10 so as to prevent the sensor 33 and the like from passing below the pattern region 11 of the mold 10. With this processing, the possibility of the particles adhering to the pattern region 11 of the mold 10 can be reduced, so that deformation of the pattern of the imprint material formed on the substrate and breakage of the mold 10 and/or the substrate 1 can be reduced. Here, in this embodiment, the sensor 33, the receptor 35, the first reference mark 31, and the second reference mark 36 are illustrated as the functional components provided in the surrounding member 3, but the present invention is not limited thereto, and another component may be provided in the surrounding member 3. For example, if a gap or a step is formed by providing some kind of mechanism or component in the surrounding member 3, the controller 19 can control the movement of the substrate stage ST so as to prevent the gap or the step from passing below the pattern region 11 of the mold 10.

Second Embodiment

The second embodiment according to the present invention will be described. In the first embodiment, an example has been described in which the movement of the substrate stage ST in the imprint process is controlled so as to prevent a plurality of functional components such as the sensor 33 from passing below the pattern region 11 of the mold 10. On the other hand, in this embodiment, an example will be described in which a plurality of functional components such as a sensor 33 are arranged in the upper surface of a substrate stage ST (surrounding member 3) such that they do not pass below a pattern region 11 of a mold 10 during movement of the substrate stage ST. Note that this embodiment basically takes over the arrangement of the imprint apparatus 100 according to the first embodiment unless otherwise specified below.

In an imprint apparatus 100 according to this embodiment, a first region 53 and a second region 54 different from the first region 53 are set in the upper surface of the substrate stage ST (surrounding member 3). The first region 53 is a region which passes below the pattern region 11 of the mold 10 during movement of the substrate stage ST between a position below a supplier 18 (dispenser) and a position below the mold 10. The second region 54 is a region which does not pass below the pattern region 11 of the mold 10 during the movement of the substrate stage ST between the position below the supplier 18 (dispenser) and the position below the mold 10. The sensor 33, a receptor 35, a first reference mark 31, and a second reference mark 36 are arranged in the second region 54. With this arrangement, it is possible to reduce the possibility of particles, which cannot be completely removed by a cleaning process and remain in the surrounding member 3, adhering to the pattern region 11 of the mold 10.

Each of FIGS. 9A and 9B is a view showing a substrate 1 and the surrounding member 3 when viewed from above (+Z direction side), and showing an arrangement example of the sensor 33 and the like in the surrounding member 3 according to this embodiment. As in the first embodiment, the sensor 33, the receptor 35, the first reference mark 31, and the second reference mark 36 are provided as functional components in the upper surface of the surrounding member 3 according to this embodiment. Further, in each of FIGS. 9A and 9B, the passing region of the upper surface of the substrate stage ST in which the pattern region 11 of the mold 10 passes during the movement of the substrate stage ST between the position below the supplier 18 and the position below the mold 10 is illustrated as the first region 53. The first region 53 is, for example, a region corresponding to the cumulative passing region 51 in the conventional imprint process shown in FIG. 8A. The region of the upper surface of the substrate stage ST other than the first region 53 is the second region 54 in which the pattern region 11 of the mold 10 does not pass during the movement of the substrate stage ST between the position below the supplier 18 and the position below the mold 10.

In the substrate stage ST shown in each of FIGS. 9A and 9B, the sensor 33, the receptor 35, the first reference mark 31, and the second reference mark 36 are arranged in the second region 54 of the upper surface of the surrounding member 3. With this arrangement, it is possible to prevent the sensor 33 and the like from passing below the pattern region 11 of the mold 10 by merely performing the conventional movement control of the substrate stage ST without performing the above-described movement control of the substrate stage ST according to the first embodiment. That is, the possibility of particles adhering to the pattern region 11 can be reduced.

Here, if the supplier 18 (dispenser) is arranged on the first direction side (+X direction side) of the mold 10, the sensor 33, the receptor 35, the first reference mark 31, and the second reference mark 36 are preferably arranged on the first direction side of the holding region of the substrate 1.

Further, in the upper surface of the substrate stage ST, the receptor 35 is preferably arranged on the first direction side of the sensor 33, the first reference mark 31, and the second reference mark 36. This is because, in order to shorten the time required for preliminary discharge of the imprint material from the supplier 18, it is desirable to arrange the receptor 35 as close to the supplier 18 as possible to shorten the movement of the substrate stage ST upon arranging the receptor 35 below the supplier 18.

In the arrangement example of the sensor 33 and the like shown in each of FIGS. 9A and 9B, the sensor 33, the receptor 35, the first reference mark 31, and the second reference mark 36 are arranged on the first direction side (+X direction side) of the holding region of the substrate 1. Further, in the arrangement example shown in FIG. 9A, the receptor 35 and the second reference mark 36 are arranged on the +Y direction side of the center (centroid) of the holding region of the substrate 1, and the sensor 33 and the first reference mark 31 are arranged on the −Y direction side of the center (centroid) of the holding region of the substrate 1. On the other hand, in the arrangement example shown in FIG. 9B, the first reference mark 31 and the second reference mark 36 are arranged on the +Y direction side of the center (centroid) of the holding region of the substrate 1, and the sensor 33 and the receptor 35 are arranged on the −Y direction side of the center (centroid) of the holding region of the substrate 1. In either of the arrangement examples shown in FIGS. 9A and 9B, the receptor 35 is arranged on the +X direction side of the sensor 33, the first reference mark 31, and the second reference mark 36.

As has been described above, in the imprint apparatus 100 according to this embodiment, in the upper surface of the substrate stage ST (surrounding member 3), the sensor 33, the receptor 35, the first reference mark 31, and the second reference mark 36 are arranged in the second region 54. With this arrangement, even by performing the conventional movement control of the substrate stage ST, it is possible to prevent the sensor 33 and the like from passing below the pattern region 11 of the mold 10, so that the possibility of particles adhering to the pattern region 11 can be reduced. Further, since the moving path of the substrate stage ST between a position below the supplier 18 and a position below the mold 10 can be shortened (short-circuited) as in the conventional movement control of the substrate stage ST, this arrangement can also be advantageous in terms of throughput.

Third Embodiment

The third embodiment according to the present invention will be described. This embodiment basically takes over the arrangement of the second embodiment, but is different from the second embodiment in that a surrounding member 3 is formed from a plurality of partial members 61 to 65.

FIG. 10 is a view showing a substrate 1 and the surrounding member 3 when viewed from above (+Z direction side), and showing the arrangement of the surrounding member 3 and an arrangement example of a sensor and the like according to this embodiment. The surrounding member 3 according to this embodiment is formed from the plurality of partial members 61 to 65. The plurality of partial member 61 to 65 can be configured to be separatable from each other and attachable/detachable (removable) individually to/from a movable member 4. In the arrangement example shown in FIG. 10, among the plurality of partial members 61 to 65 forming the surrounding member 3, a first region 53 is arranged in the partial member 61. Further, a second reference mark 36 is provided in the partial member 62, a receptor 35 is provided in the partial member 63, a sensor 33 is provided in the partial member 64, and a first reference mark 31 is provided in the partial member 65.

By individually providing the partial members 61 to 65 with the respective functional components such as the sensor, that is, by providing one partial member with one functional component, it is possible to remove the partial member corresponding to each functional component and perform maintenance thereof easily. For example, when performing maintenance of the sensor 33, it is only required to remove the partial member 64 from the movable member 4, and this facilitates the maintenance. Here, since each of the partial members 61 to 65 is removed at the time of maintenance, it is required to be removably fixed to the movable member 4 by a screw or the like. However, if the screw or the like is used to fix the component in the upper surface of corresponding one of the partial members 61 to 65, a concave shape is formed by the screw or the like. This is undesirable because particles tend to remain in the concave shape. Therefore, in order to make the upper surface of each partial member 61 to 65 a flat shape, the component is preferably fixed from the back surface or the side surface of the partial member using the screw or the like.

In addition, when the surrounding member 3 is formed from the plurality of partial members 61 to 65, grooves are formed among the plurality of partial members 61 to 65. Particles tend to remain in such grooves, and a cleaning process cannot completely remove the particles. Accordingly, if the groove is arranged in the first region 53, the particle existing in the groove is likely to adhere to a pattern region 11 of a mold 10. Therefore, in this embodiment, the partial member 61 is formed from one structure so as not to form the groove in the first region 53. That is, the surrounding member 3 is formed such that the grooves formed among the plurality of partial members 61 to 65 are arranged in the second region 54. With this arrangement, the surrounding member 3 in the first region 53 can have a flat shape, so that the possibility of particles adhering to the pattern region 11 of the mold 10 can be reduced.

Embodiment of Method of Manufacturing Article

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 11A:
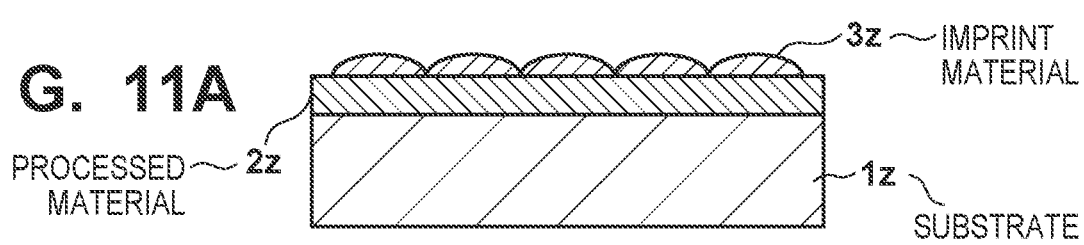
FIGS. 11A to 11F are views showing a method of manufacturing an article.

A detailed method of manufacturing an article will be described next. As shown in FIG. 11A, a substrate $1z$ such as a silicon wafer with a target material $2z$ to be processed such as an insulator formed on the surface is prepared. Next, an imprint material $3z$ is applied to the surface of the target material $2z$ by an inkjet method or the like. A state in which the imprint material $3z$ is applied as a plurality of droplets onto the substrate is shown here.

Figure 11B:
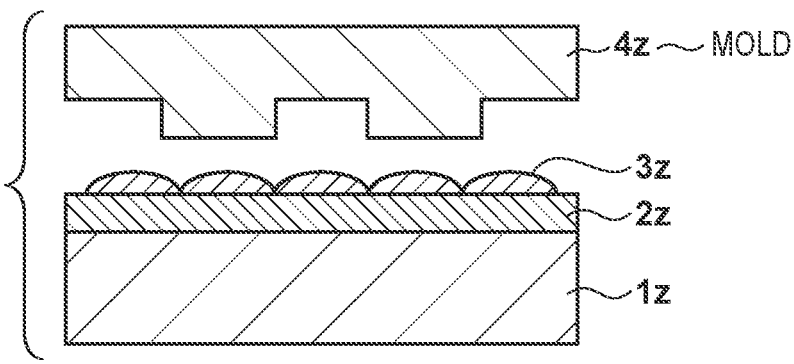
Figure 11C:
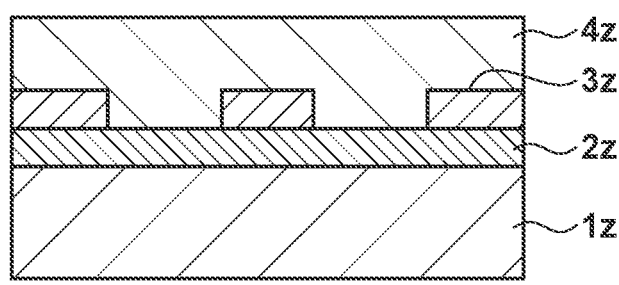

As shown in FIG. 11B, a mold $4z$ for imprint is caused to face to the substrate $1z$ such that a pattern with convex and concave portions formed in the mold $4z$ is directed to the imprint material $3z$ on the substrate $1z$. As shown in FIG. 11C, the mold $4z$ and the imprint material $3z$ applied on the substrate $1z$ are brought into contact with each other, and subjected to a pressure. The gap between the mold $4z$ and the target material $2z$ is filled with the imprint material $3z$. In this state, by irradiating the imprint material $3z$ with energy for curing through the mold $4z$, the imprint material $3z$ is cured.

Figure 11D:
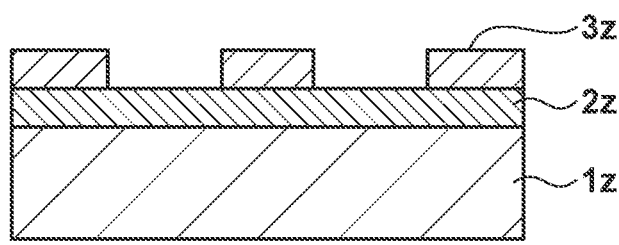

As shown in FIG. 11D, after the imprint material $3z$ is cured, the mold $4z$ is separated from the substrate $1z$. Then, the pattern of the cured material of the imprint material $3z$ is formed on the substrate $1z$. In the pattern of the cured material, the concave portion of the mold corresponds to the convex portion of the cured material, and the convex portion of the mold corresponds to the concave portion of the cured material. That is, the pattern with convex and concave portions in the mold $4z$ is transferred to the imprint material $3z$.

Figure 11E:
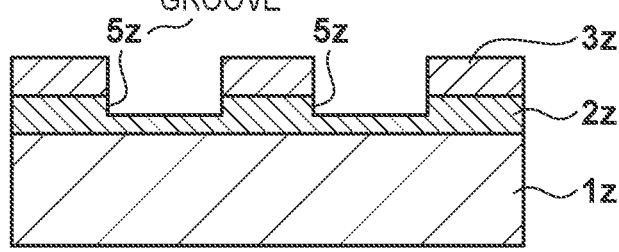
Figure 11F:
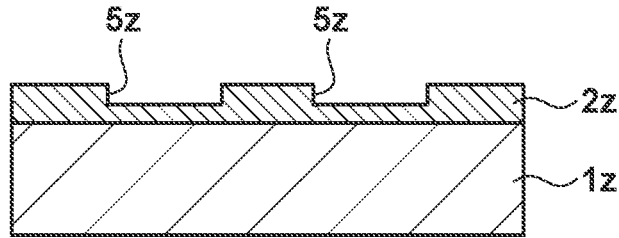

As shown in FIG. 11E, by performing etching process using the pattern of the cured material as an etching resistant mask, a portion of the surface of the target material $2z$ where the cured material does not exist or remains thin is removed to form a groove $5z$. As shown in FIG. 11F, by removing the pattern of the cured material, an article with the grooves $5z$ formed in the surface of the target material $2z$ can be obtained. Here, the pattern of the cured material is removed. However, instead of processing or removing the pattern of the cured material, it may be used as, for example, an interlayer dielectric film included in a semiconductor element or the like, that is, a constituent member of an article.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-084790 filed on May 13, 2020, which is hereby incorporated by reference herein in its entirety.

What is claimed is:

1. An imprint apparatus that forms a pattern on an imprint material on a substrate using a mold including a pattern region, the apparatus comprising:
   a stage configured to be movable while holding the substrate;
   a mold holder configured to hold the mold including the pattern region;
   a dispenser configured to discharge the imprint material on the substrate;
   a controller configured to control movement of the stage;
   a sensor configured to detect an illuminance of light which cures the imprint material; and
   a receptor configured to periodically receive the imprint material preliminarily discharged from the dispenser, the controller movement of the stage configured to position the receptor below the dispenser for the preliminary discharge,
   wherein the sensor, the receptor, and a mark used to detect a position of the stage are provided around a holding region located in an upper surface of the stage,
   wherein the substrate is held in the holding region of the stage,
   wherein the upper surface of the stage includes a first region,
   wherein the sensor, the receptor, and the mark are arranged in the second region, and
   wherein throughout an imprint process successively imprinting shots of the imprint material on the substrate, the controller is configured to control movement of the stage between a position below the dispenser and a position below the mold such that the first region passes below the pattern region and the second region does not pass below the pattern region and such that the first region passes between at least two of the sensor, the receptor, and the mark.

2. The apparatus according to claim 1,
   wherein the dispenser is arranged on a first direction side of the mold, and
   wherein, in the upper surface of the stage, the receptor is arranged on the first direction side of the sensor and the mark.

3. The apparatus according to claim 2, wherein, in the upper surface of the stage, the sensor, the receptor, and the mark are arranged on the first direction side of the holding region.

4. The apparatus according to claim 1,
wherein the stage includes a surrounding member provided around the holding region, and
wherein the sensor, the receptor, and the mark are arranged in the second region in the surrounding member.

5. The apparatus according to claim 4, wherein the surrounding member includes a plurality of partial members, and the surrounding member is formed such that a groove formed between the plurality of partial members is arranged in the second region.

6. The apparatus according to claim 1, wherein each of the receptor and the mark is formed by a step formed in the upper surface of the stage.

7. The apparatus according to claim 1, wherein the sensor is arranged in a concave portion formed in the upper surface of the stage.

8. The apparatus according to claim 1, wherein the mark includes at least one of a first mark used to detect a position of the stage with respect to the mold and a second mark used to detect a position of the stage with respect to a conveyance mechanism configured to convey the substrate.

9. The apparatus according to claim 1, wherein the receptor is provided closer to the dispenser than the sensor and the mark.

10. A method of manufacturing an article, the method comprising:
forming a pattern on a substrate using an imprint apparatus according to claim 1; and
processing the substrate, on which the pattern has been formed, to manufacture the article.

11. An imprint apparatus that executes a process of forming a pattern on an imprint material on a substrate by successively imprinting shots of the imprint material using a mold including a pattern region, the apparatus comprising:
a stage configured to be movable while holding the substrate;
a mold holder configured to hold the mold including the pattern region;
a dispenser configured to discharge the imprint material on the substrate;
a controller configured to control movement of the stage;
a sensor configured to detect an illuminance of light which cures the imprint material; and
a receptor configured to periodically receive the imprint material preliminarily discharged from the dispenser, the controller movement of the stage configured to position the receptor below the dispenser for the preliminary discharge,
wherein the sensor, the receptor, and a mark used to detect a position of the stage are provided around a holding region located in an upper surface of the stage,
wherein the substrate is held in the holding region of the stage, and
wherein the controller is configured to control movement of the stage between a position below the dispenser and a position below the mold such that the mold passes between at least two of the sensor, the receptor, and the mark so as to prevent the sensor, the receptor, and the mark from passing below the pattern region throughout the process.

12. The apparatus according to claim 11, wherein the controller is configured to determine a moving path of the stage between the position below the dispenser and the position below the mold so as to prevent the sensor, the receptor, and the mark from passing below the pattern region, and to control the movement of the stage in accordance with the moving path.

13. The apparatus according to claim 12, wherein the controller is configured to determine the moving path in a case where it is determined that at least one of the sensor, the receptor, and the mark passes below the pattern region during movement of the stage between the position below the dispenser and the position below the mold in a shortest path.

14. The apparatus according to claim 11, wherein the receptor is provided closer to the dispenser than the sensor and the mark.

* * * * *